(12) United States Patent
Asai

(10) Patent No.: US 7,326,586 B2
(45) Date of Patent: Feb. 5, 2008

(54) METHOD FOR MANUFACTURING SEMICONDUCTOR PHYSICAL QUANTITY SENSOR

(75) Inventor: Makoto Asai, Kariya (JP)

(73) Assignee: DENSO CORPORATION, Kariya (JP)

( * ) Notice: Subject to any disclaimer, the term of this patent is extended or adjusted under 35 U.S.C. 154(b) by 381 days.

(21) Appl. No.: 11/172,787

(22) Filed: Jul. 5, 2005

(65) Prior Publication Data

US 2006/0008936 A1      Jan. 12, 2006

(30) Foreign Application Priority Data

Jul. 6, 2004   (JP)   ............................. 2004-199739
May 31, 2005   (JP)   ............................. 2005-160600

(51) Int. Cl.
*H01L 21/00*   (2006.01)
(52) U.S. Cl. .......................................... 438/50; 438/52
(58) Field of Classification Search ................. 438/48, 438/50, 51, 52, 53; 257/415, 417, 420
See application file for complete search history.

(56) References Cited

U.S. PATENT DOCUMENTS

| | | | |
|---|---|---|---|
| 5,461,916 A | 10/1995 | Fujii et al. | |
| 5,616,523 A | 4/1997 | Benz et al. | |
| 6,130,109 A * | 10/2000 | Jerominek et al. | 438/53 |
| 6,227,049 B1 | 5/2001 | Fujii | |
| 6,433,401 B1 * | 8/2002 | Clark et al. | 257/524 |
| 6,849,912 B2 * | 2/2005 | Bertz et al. | 438/50 |
| 7,083,997 B2 * | 8/2006 | Brosnihhan et al. | 438/50 |

* cited by examiner

*Primary Examiner*—Kevin M. Picardat
(74) *Attorney, Agent, or Firm*—Posz Law Group, PLC

(57) ABSTRACT

A method for manufacturing a semiconductor physical quantity sensor is provided. The sensor includes a multi-layered substrate, a cavity, a groove, a movable portion and a fixed portion. The multi-layered substrate includes a support substrate, an embedded insulation film, and a semiconductor layer. The method includes the steps of: preparing the multi-layered substrate having a sacrifice layer embedded in the semiconductor layer so that the sacrifice layer is disposed at a cavity-to-be-formed portion; forming the groove from the semiconductor layer to reach the sacrifice layer; and selectively etching the sacrifice layer from a bottom of the groove to form a cavity.

6 Claims, 23 Drawing Sheets

METHOD FOR MANUFACTURING SEMICONDUCTOR PHYSICAL QUANTITY SENSOR

CROSS REFERENCE TO RELATED APPLICATIONS

This application is based on Japanese Patent Applications No. 2004-199739 filed on Jul. 6, 2004, and No. 2005-160600 filed on May 31, 2005, the disclosures of which are incorporated herein by references.

FIELD OF THE INVENTION

The present invention relates to a method for manufacturing a semiconductor physical quantity sensor.

BACKGROUND OF THE INVENTION

A physical quantity sensor having a beam structure formed in a semiconductor substrate is disclosed in, for example, Japanese Patent Application Publication No. H06-349806. The beam structure is formed in the substrate by a micro machining method. As shown in FIG. 19A, a SOI substrate having a silicon substrate 200, an embedded oxide film 201 and a silicon layer 202 is prepared. The silicon layer 202 is formed on the silicon substrate 200 through the embedded oxide film 201. A groove 210 is formed in the silicon layer 202. The groove 210 extends in a vertical direction of the substrate 200, and reaches the embedded oxide film 201. Then, a part of the embedded oxide film 201 disposed under a movable portion 211 is removed completely by a sacrifice layer etching method. Thus, the movable portion 211 becomes movable. Further, another part of the embedded oxide film 201 disposed under the fixed portion 212 remains so that the fixed portion 212 is supported on the substrate 200 through the embedded oxide film 201.

However, as shown in FIG. 19B, the other part of the embedded oxide film 201 disposed under the fixed portion 212 is partially removed when the part of the embedded oxide film 201 disposed under the movable portion 211 is removed completely. Therefore, it is required that the width W1 of the fixed portion 212 is sufficiently wider than the width W2 of the movable portion 211 when the fixed portion 212 and the movable portion 211 are designed. The widths of the fixed and the movable portions 211, 212 are determined by using an etching rate of the oxide film 201. Thus, the oxide film 201 remains under the fixed portion 212.

Thus, it is difficult to form the movable portion 211 and the fixed portion 212 with high accuracy. Further, design degree of freedom of the sensor is limited.

SUMMARY OF THE INVENTION

In view of the above-described problem, it is an object of the present invention to provide a method for manufacturing a physical quantity sensor with high manufacturing accuracy.

A method for manufacturing a semiconductor physical quantity sensor is provided. The sensor includes a multi-layered substrate, a cavity, a groove, a movable portion and a fixed portion. The multi-layered substrate includes a support substrate, an embedded insulation film, and a semiconductor layer, which are stacked in this order. The cavity extends in a horizontal direction of the multi-layered substrate and disposed between the semiconductor layer and the embedded insulation film. The groove is disposed in the semiconductor layer and reaches the cavity. The movable portion is disposed in the semiconductor layer and separated from the embedded insulation film by the groove and the cavity so that the movable portion is movable. The fixed portion is supported on the support substrate and separated by the groove. The method includes the steps of: preparing the multi-layered substrate having a sacrifice layer, which is embedded in the semiconductor layer so that the sacrifice layer is disposed at a cavity-to-be-formed portion; forming the groove from an upper surface of the semiconductor layer by a trench etching method, wherein the groove extends in a vertical direction of the multi-layered substrate and reaches the sacrifice layer; and selectively etching the sacrifice layer from a bottom of the groove to form the cavity extending in the horizontal direction so that the movable portion is formed.

The method provides the physical quantity sensor with high manufacturing accuracy. Further, design degree of freedom of the sensor becomes larger.

Preferably, the step of preparing the multi-layered substrate includes the steps of: forming a first substrate having the support substrate and the embedded insulation film, which works as an etching stopper; forming a second substrate having the semiconductor layer and the sacrifice layer, which is embedded on a surface of the semiconductor layer; and bonding the first and the second substrates so that the multi-layered substrate is formed.

Preferably, the step of preparing the multi-layered substrate includes the steps of: forming a first substrate having the support substrate, the embedded insulation film, a first semiconductor layer and the sacrifice layer, wherein the embedded insulation film works as an etching stopper, wherein the semiconductor layer is disposed on the support substrate through the embedded insulation film, and wherein the sacrifice layer is embedded on a surface of the semiconductor layer; preparing a second substrate having a second semiconductor layer; and bonding the first and the second substrates so that the multi-layered substrate is formed.

Preferably, the step of preparing the multi-layered substrate includes the steps of: forming the embedded insulation film as an etching stopper on the support substrate; forming the sacrifice layer on the embedded insulation film; and forming the semiconductor layer made of poly crystal semiconductor on the sacrifice layer so that the multi-layered substrate is prepared.

Further, a method for manufacturing a semiconductor physical quantity sensor is provided. The sensor includes a multi-layered substrate, a cavity, a groove, a movable portion and a fixed portion. The multi-layered substrate includes a support substrate, an embedded insulation film, and a semiconductor layer, which are stacked in this order. The cavity extends in a horizontal direction of the multi-layered substrate and disposed between the semiconductor layer and the support substrate. The groove is disposed in the semiconductor layer and reaches the cavity. The movable portion is disposed in the semiconductor layer and separated from the support substrate by the groove and the cavity so that the movable portion is movable. The fixed portion is separated by the groove. The method includes the steps of: preparing the multi-layered substrate having a sacrifice layer, which includes a thin portion and a thick portion, and is embedded in the semiconductor layer, wherein the thin portion of the sacrifice layer is disposed under a fixed-portion-to-be-formed portion, and the thick portion of the sacrifice layer is disposed at a cavity-to-be-formed portion; forming the groove from an upper surface of the semiconductor layer by a trench etching method, wherein the groove extends in a vertical direction of the multi-layered substrate and reaches the sacrifice layer; and isotropically etching the sacrifice layer from a bottom of the groove to remove the thick portion of the sacrifice layer and to remain the thin portion of the sacrifice layer as the embedded insulation film so that the cavity, the movable portion and the fixed portion are formed.

The above method provides the physical quantity sensor with high manufacturing accuracy. Further, design degree of freedom of the sensor becomes larger.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
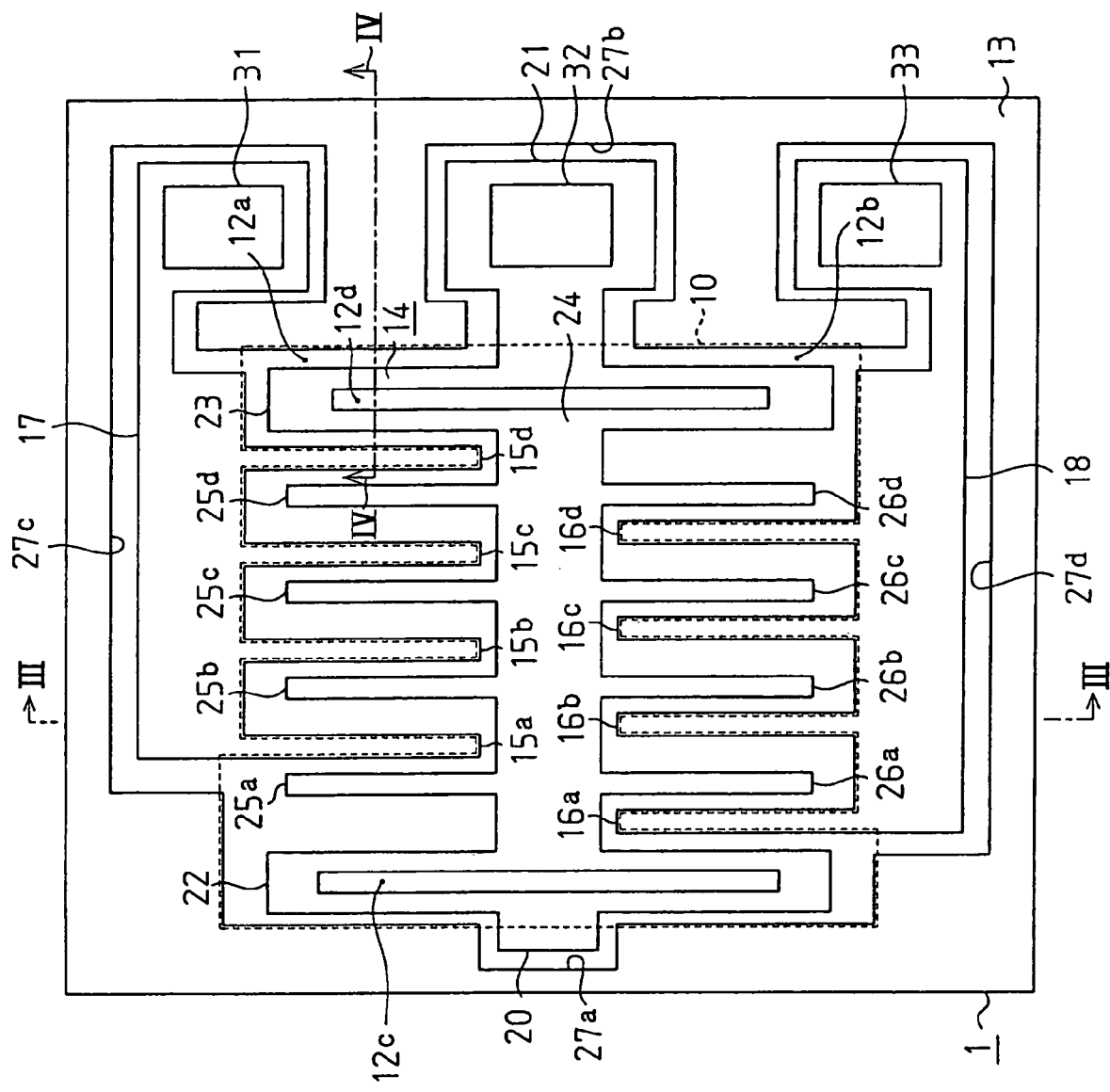
FIG. 1 is a plan view showing a semiconductor acceleration sensor according to a first embodiment of the present invention.
Figure 2:
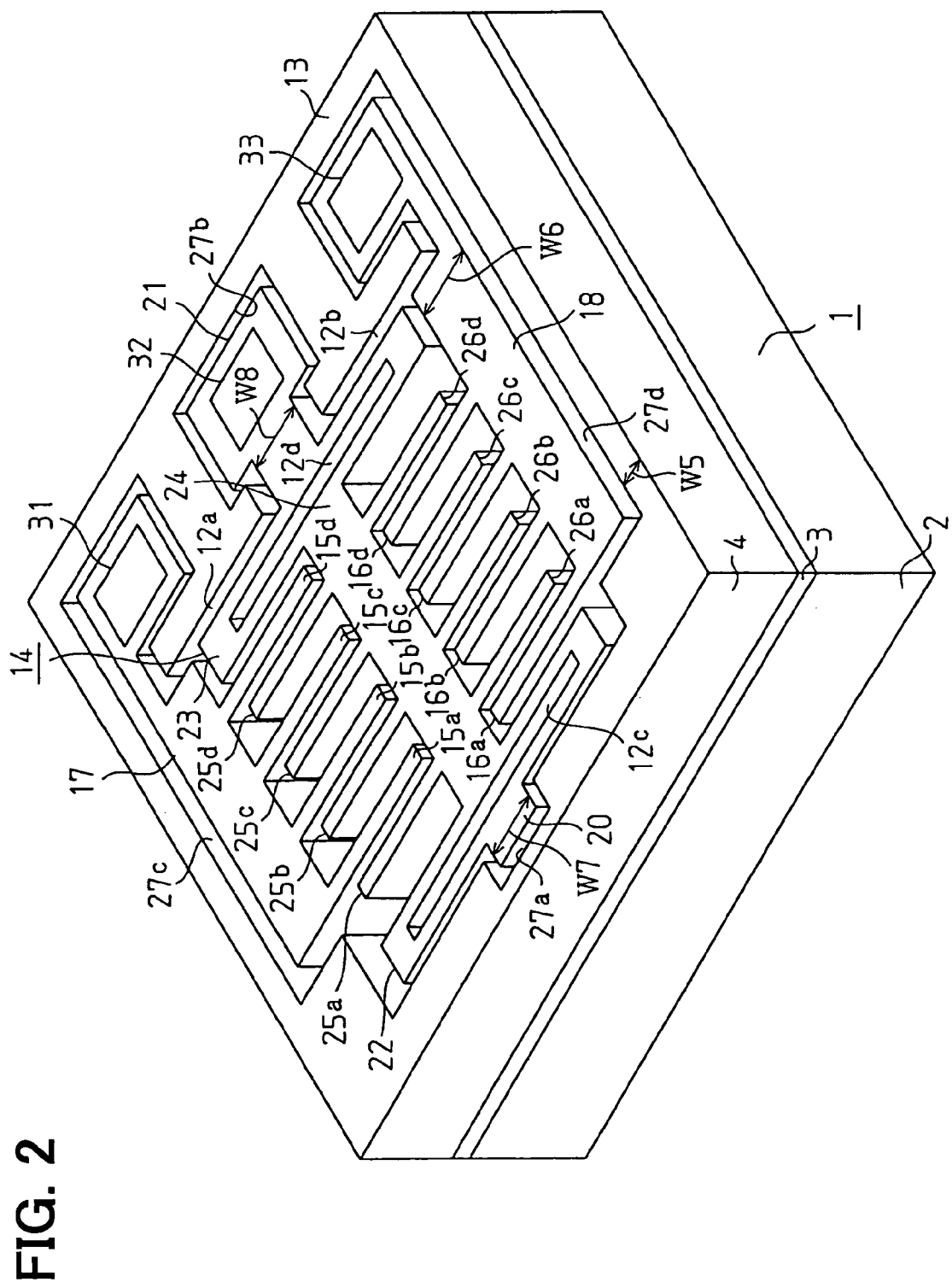
FIG. 2 is a perspective view showing the sensor according to the first embodiment.
Figure 3:
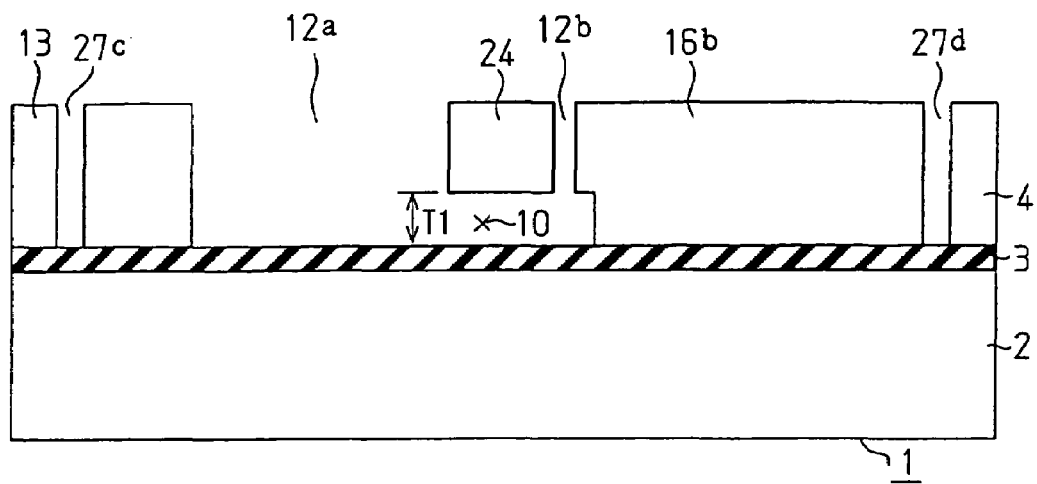
FIG. 3 is a cross sectional view showing the sensor taken along line III-III in FIG. 1.

A semiconductor physical quantity sensor according to a first embodiment of the present invention is shown in FIGS. 1 to 3. The sensor is an acceleration sensor. In FIG. 3, the sensor is manufactured by a multi-layered substrate 1, which is made of a SOI substrate. The substrate 1 includes a silicon substrate 2, an embedded insulation film 3 and a silicon layer 4, which are stacked in this order. The embedded insulation film 3 is made of a silicon nitridefilm (i.e., a SiN film). A cavity 10 is formed in the silicon layer 4 of the substrate 1. The cavity 10 has a predetermined height of T1. The cavity 10 extends in a horizontal direction (i.e., a lateral direction) of the substrate 1. A formation region of the cavity 10 is shown as a broken line in FIG. 1.

Multiple grooves 12a-12d are formed in the silicon layer 4, and disposed over the cavity 10. These grooves 12a-12d extend in a vertical direction of the substrate 1. Further, the grooves 12a-12d reach the cavity 10. Other grooves 27a-27d are formed in the silicon layer 4 disposed besides the cavity 10. The grooves 27a-27d extend in the vertical direction of the substrate 1. The grooves 27a-27d reach the embedded insulation film 3. A square frame 13, a beam structure 14, multiple fixed electrodes 15a-15d, 16a-16d and two fixed electrode lead portions 17, 18 are separated and partitioned by the grooves 12a-12d, 27a-27d and the cavity 10. The frame 13 is formed of the multi-layered substrate 1.

The embedded insulation film 3 in the substrate 1 works as an etching stopper when the cavity 10 is formed by a sacrifice layer etching method. In FIGS. 1 and 2, the beam structure 14 is composed of a pair of anchors 20, 21, a pair of beams 22, 23, a weight portion 24 and multiple movable electrodes 25a-25d, 26a-26d. No cavity 10 is disposed under the frame 13, the fixed electrode lead portions 17, 18, the fixed electrodes 15a-15d, 16a-16d and the anchors 20, 21 so that they are fixed on the substrate 1. The cavity 10 is disposed under the beams 22, 23, the weight portion 24 and the movable electrodes 25a-25d, 26a-26d. The weight portion 24 is connected to the anchors 20, 21 through the beams 22, 23. Four movable electrodes 25a-25d protrude from one side of the weight portion 24. Other four movable electrodes 26a-26d protrude from the other side of the weight portion 24. The movable electrodes 25a-25d, 26a-26d provide a comb-teeth shape having multiple comb-teeth extending in parallel by a predetermined interval. A movable portion is composed of the beams 22, 23, the weight portion 24 and the movable electrodes 25a-25d, 26a-26d. The weight portion 24 and the movable electrodes 25a-25d, 26a-26d are displaceable in accordance with acceleration applied to the sensor. Specifically, the weight portion 24 and the movable electrodes 25a-25d, 26a-26d are movable in a direction parallel to the surface of the substrate 1, the direction being a right-left direction in FIG. 1.

In FIGS. 1 and 2, each fixed electrode 15a-15d faces one side of the movable electrode 25a-25d. Similarly, each fixed electrode 16a-16d faces one side of the movable electrode 26a-26d.

The frame 13 and the anchors 20, 21 of the beam structure 14 are electrically separated each other by the grooves 27a, 27b. Specifically, the movable electrodes 25a-25d, 26a-26d of the beam structure 14 are electrically isolated each other by air isolation method. Similarly, the frame 13 and the fixed electrode lead portion 17 are separated each other by the groove 27c. Further, the frame 13 and the fixed electrode lead portion 18 are separated each other by the groove 27d. Thus, the fixed electrodes 15a-15d, 16a-16d are electrically isolated by the air isolation method.

As shown in FIGS. 1 and 2, the fixed electrodes 15a-15d, 16a-16d are electrically connected to an external circuit through pads 31, 33 disposed on the fixed electrode lead portions 17, 18, respectively. Further, the movable electrodes 25a-25d, 26a-26d are electrically connected to the external circuit through another pad 32 disposed on the anchor 21.

Thus, the semiconductor acceleration sensor is made of the multi-layered substrate 1 composed of the silicon substrate 2 as the support substrate, the embedded insulation film 3 and the silicon layer 4 as the semiconductor layer. The cavity 10 extends in the horizontal direction of the substrate 1, and the grooves 12a-12d reach the cavity 10. The cavity 10 and the grooves 12a-12d provide the movable portion, which is composed of the beams 22, 23, the weight portion 24, and the movable electrodes 25-a25d, 26a-26d. The grooves 12a-12d separate between the frame 13 and the fixed electrodes 15a-15d, 16a-16d.

The first capacitor is formed between the movable electrodes 25a-25d and the fixed electrodes 15a-15d. The second capacitor is formed between the movable electrodes 26a-26d and the fixed electrodes 16a-16d. The distance between the movable electrodes 25a-25d and the fixed electrodes 15a-15d and the distance between the movable electrodes 26a-26d and the fixed electrodes 16a-16d are differentially changeable so that the capacitances of the first and the second capacitors are also differentially changed. On the basis of these capacitance changes of the capacitors, the acceleration applied to the sensor is detected.

The method for manufacturing the sensor is described as follows.

Figure 4:
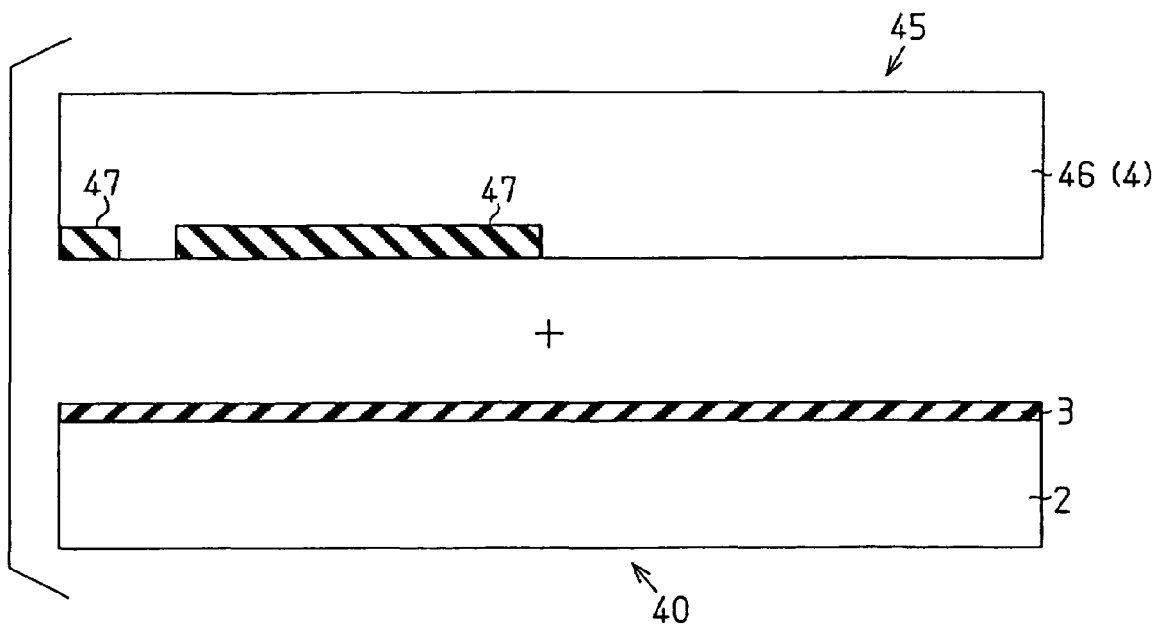
FIG. 4 is a cross sectional view explaining a method for manufacturing the sensor according to the first embodiment.

As shown in FIG. 4, the first substrate 40 and the second substrate 45 are bonded so that the multi-layered substrate 1 is formed. A sacrifice oxide film 47 is patterned and embedded in the second substrate 45. Specifically, the first substrate 40 includes the silicon substrate 2 and the embedded insulation film 3, which is disposed on the silicon substrate 2. In the second substrate 45, the sacrifice oxide film 47 is disposed on a predetermined part of the surface of the silicon substrate 46. The predetermined part of the substrate 46 is a cavity-to-be-formed portion. The first and the second substrates 40, 45 are bonded so that the multi-layered substrate 1 is prepared. Here, the sacrifice oxide film 47 is made of material having sufficient etching selectivity compared with silicon.

Figure 5A:
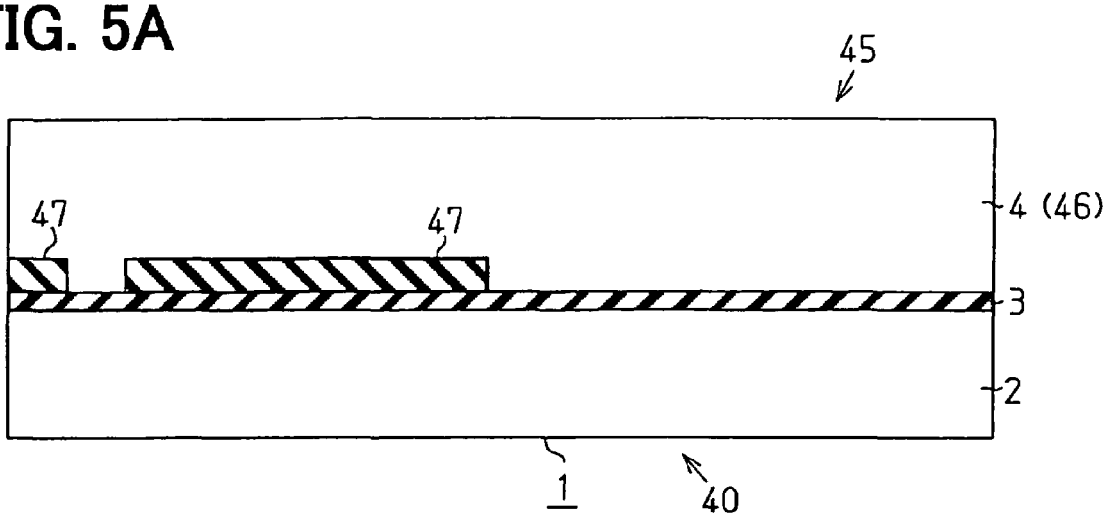
FIGS. 5A to 5C are cross sectional views explaining the method for manufacturing the sensor according to the first embodiment.
Figure 5B:
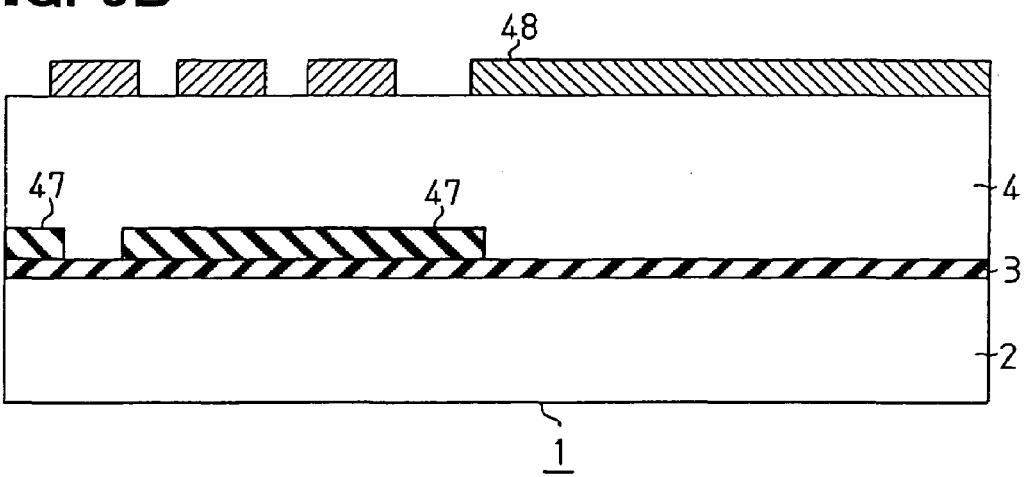
Figure 5C:
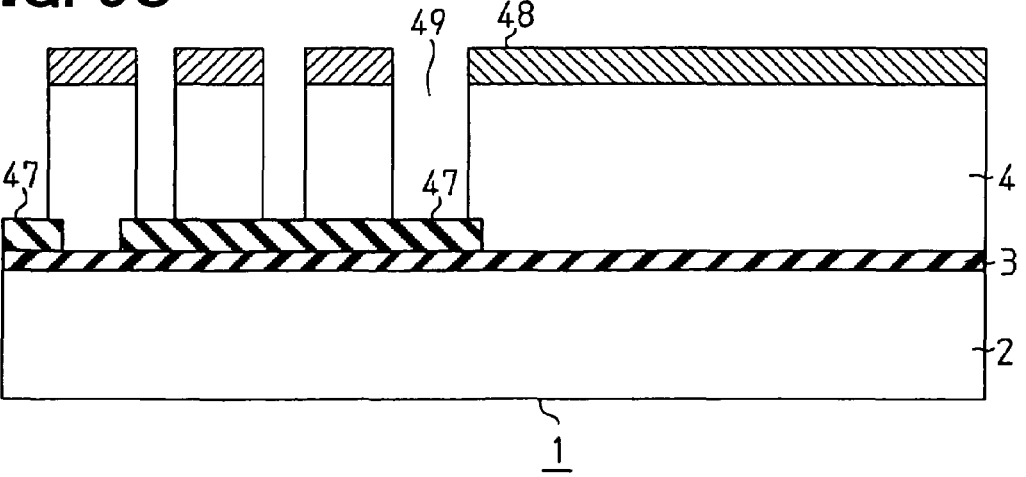

As shown in FIG. 5B, a mask 48 is formed on the upper surface of the substrate 1, and patterned to be a predetermined pattern. The upper surface of the substrate 1 is the surface of the silicon layer 4. As shown in FIG. 5C, the silicon layer 4 is etched by a trench etching method with using the mask 48 so that a groove 49 is formed in the silicon layer 4. The groove 49 reaches the sacrifice oxide film 47. The groove 49 extends in the vertical direction of the substrate 1. The sacrifice oxide film 47 works as a sacrifice layer. Further, the grooves 27a-27d are formed in the silicon layer 4.

Figure 6A:
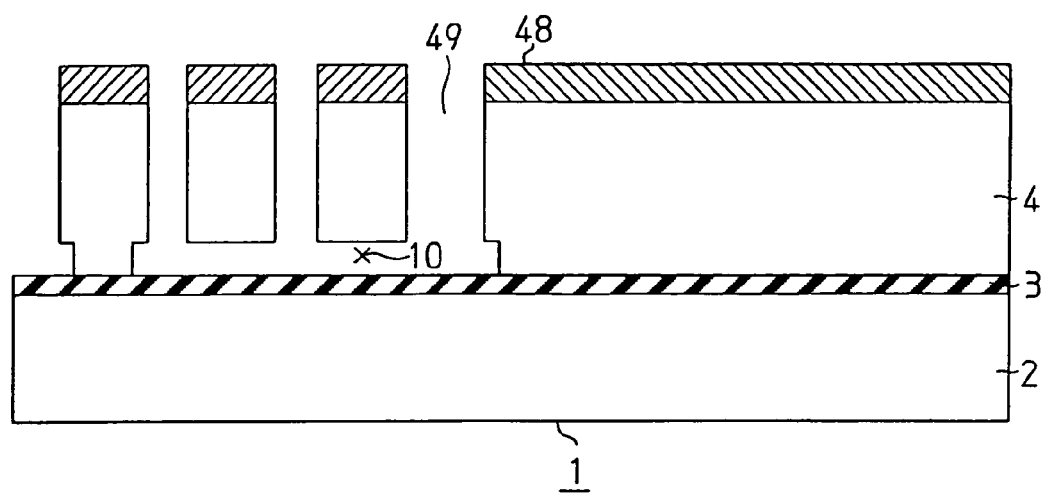
FIGS. 6A and 6B are cross sectional views explaining the method for manufacturing the sensor according to the first embodiment.
Figure 6B:
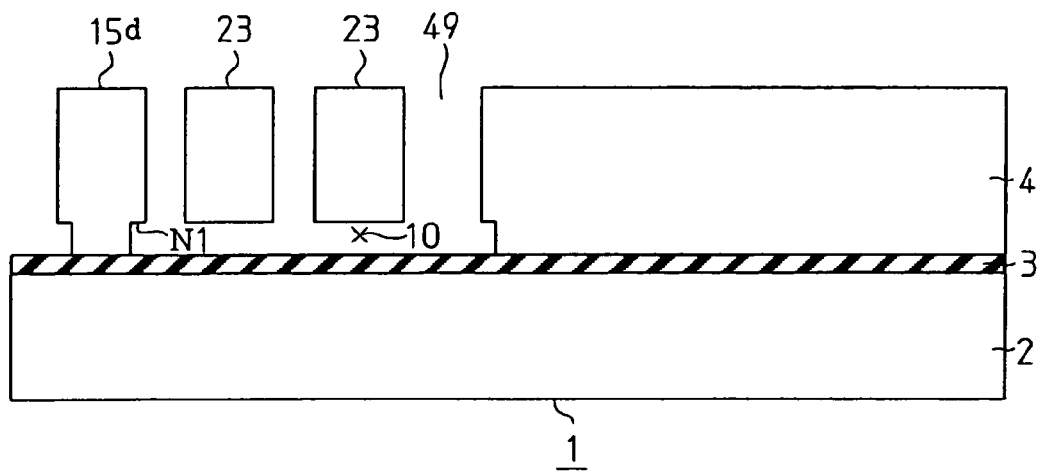

As shown in FIG. 6A, the sacrifice oxide film 47 disposed on the bottom of the groove 49 is etched and removed so that the cavity 10 is formed. The film 47 is etched in the horizontal direction of the substrate 1. At this time, the embedded insulation film 3 made of the silicon nitride film works as the etching stopper so that only the sacrifice oxide film 47 is removed. Thus, the movable portion can be movable. The sacrifice oxide film 47 as the sacrifice layer is selectively etched from the bottom of the groove 49 so that the cavity 10 extending in the horizontal direction is formed. Then, the mask is removed, as shown in FIG. 6B.

Figure 7A:
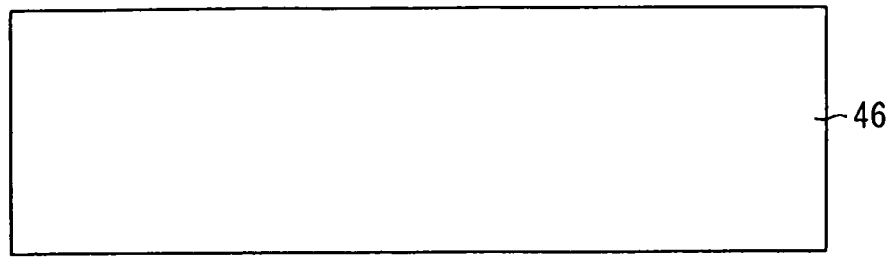
FIGS. 7A to 7D are cross sectional views explaining a method for manufacturing the second substrate of the sensor according to the first embodiment.
Figure 7B:
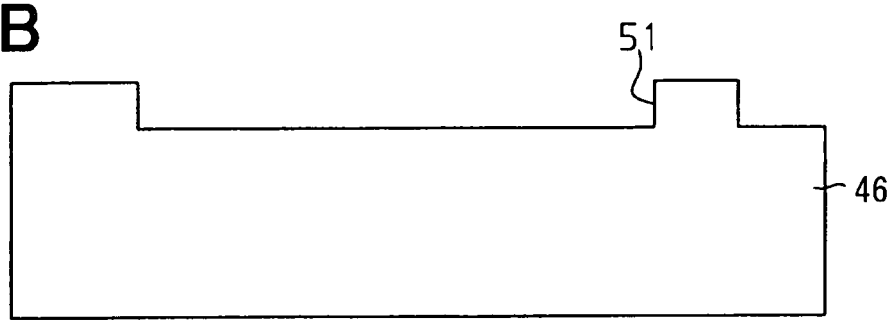
Figure 7C:
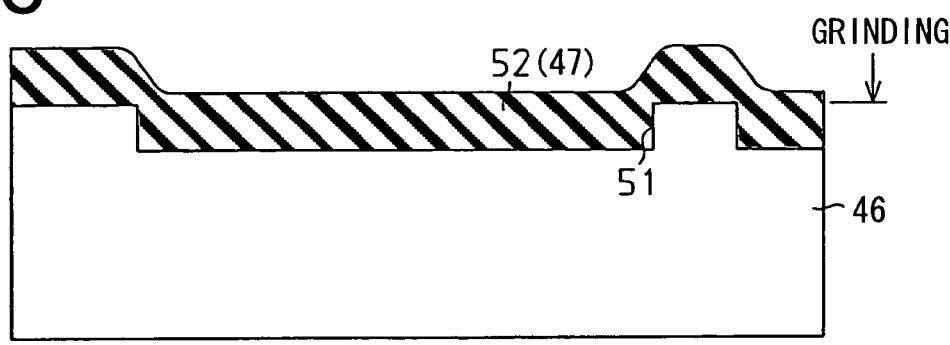
Figure 7D:
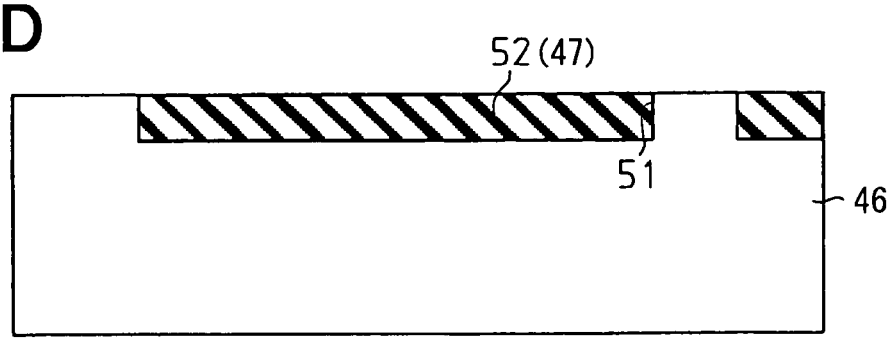

Here, the method for forming the second substrate 45 is described as follows. As shown in FIG. 7A, a silicon substrate 46 is prepared. Then, as shown in FIG. 7B, a groove 51 is formed on a predetermined portion of the surface of the substrate 46. Then, a silicon oxide film 52 is deposited on the substrate 46 to fill the groove 51. Then, the surface of the substrate 46 is polished and grinded by a CMP method so that the silicon oxide film 52 is embedded in a predetermined portion of the substrate 46. Thus, the second substrate 45 is obtained.

The first embodiment has the following characteristics. In the first step for manufacturing the semiconductor acceleration sensor, the multi-layered substrate 1 is prepared. The sacrifice oxide film 47 as the sacrifice layer is embedded in the substrate 1. Specifically, the film 47 is disposed on a portion to be the cavity 10 in the silicon layer 4. In the second step, the groove 49 is formed in the silicon layer 4 by the trench etching method. The groove 49 extends in the vertical direction of the substrate 1, and reaches the sacrifice oxide film 47. In the third step, the sacrifice oxide film 47 is selectively etched from the bottom of the groove 49 so that the cavity 10 is formed to extend in the horizontal direction. Thus, the movable portion is formed. Accordingly, when the sacrifice oxide film 47 is removed, only a predetermined portion remains so that a fixed portion on the silicon substrate 2 having a narrow width is formed. Specifically, the sacrifice oxide film 47 is preliminary patterned so that the fixed portion and the movable portion are selectively determined. Then, the movable portion is released from the surface of the substrate 2. In the prior art, the width of the fixed portion is necessitated to be larger than the width of the movable portion. However, in this embodiment, the width of the fixed portion can be designed equal to the width of the movable portion. Thus, the dimensions of each part of the sensor such as the beam structure can be minimized. Specifically, widths W5-W8 of the fixed portion in FIG. 2 can be narrowed. The fixed portion having narrow width can be formed. Thus, the dimensions of the sensor become smaller. Further, the fixed portion is securely fixed on the substrate 2. Furthermore, the design degree of freedom in the beam structure becomes larger. Thus, the movable portion and the fixed portion can be formed with high accuracy.

Figure 8A:
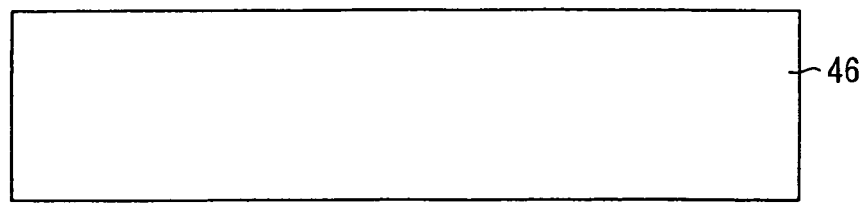
FIGS. 8A to 8D are cross sectional views explaining another method for manufacturing the second substrate of the sensor according to the first embodiment.
Figure 8B:
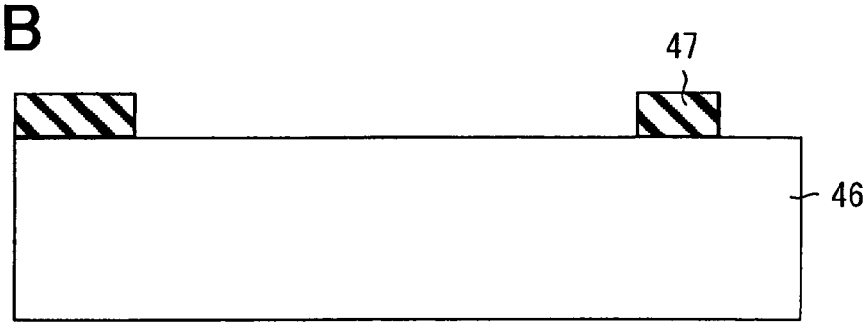
Figure 8C:
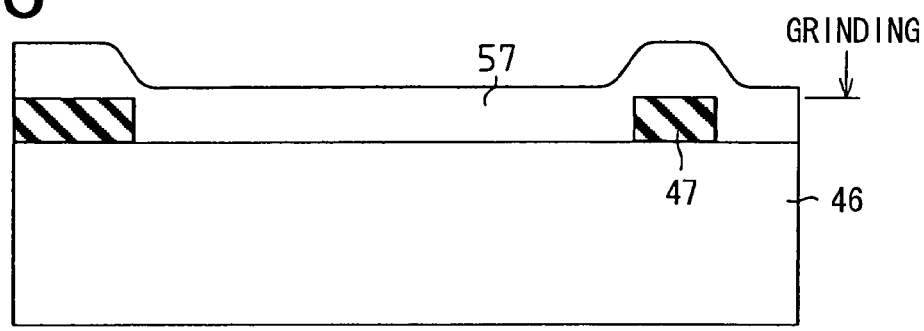
Figure 8D:
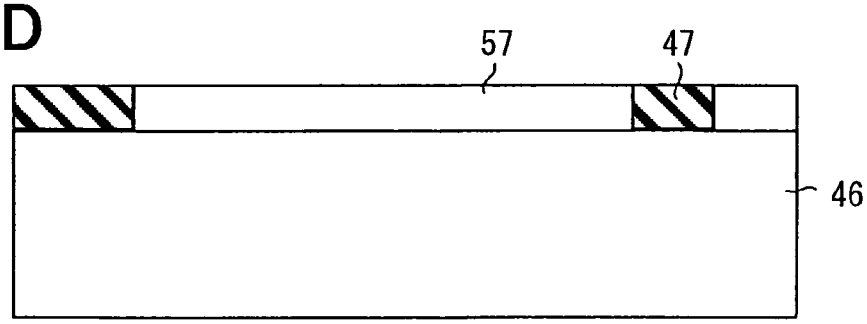

The second substrate can be formed by other methods. For example, as shown in FIG. 8A, the silicon substrate 46 is prepared. Then, as shown in FIG. 8B, the sacrifice oxide film 47 having a predetermined pattern is formed on the silicon substrate 46. Then, an epitaxial film 57 is deposited on the silicon substrate 47 by an epitaxial growth method so that the epitaxial film 57 covers the surface of the substrate 46 and the sacrifice oxide film 47. Accordingly, the epitaxial film 57 fills in a concavity in the sacrifice oxide film 47. Further, the surface of the epitaxial film 57 is polished and grinded, as shown in FIG. 8D. Thus, the second substrate 45 having the sacrifice oxide film 47 embedded on a predetermined surface of the substrate 45 is prepared.

Further, the second substrate can be formed by the third method described as follows.

Figure 9A:
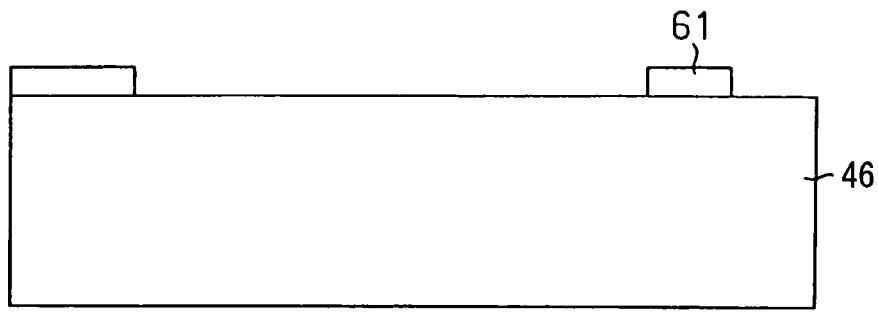
FIGS. 9A and 9B are cross sectional views explaining the third method for manufacturing the second substrate of the sensor according to the first embodiment.
Figure 9B:
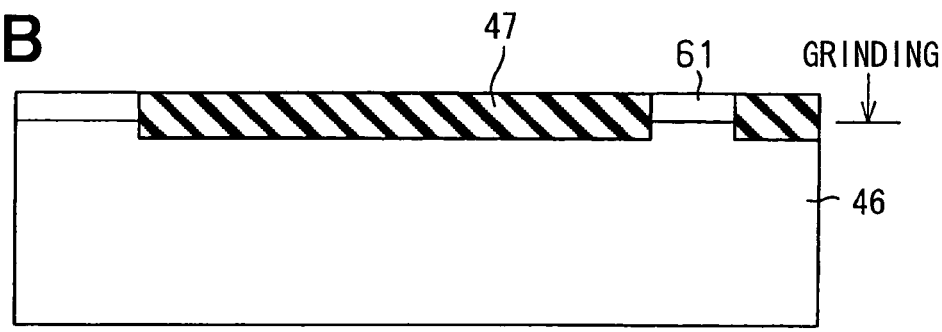

As shown in FIG. 9A, the silicon substrate 46 is prepared. A mask 61 made of an insulation film such as a nitride film is formed on the surface of the substrate 46. As shown in FIG. 9B, the exposed surface of the substrate 46, on which no mask 61 is disposed, is thermally oxidized so that the thermal oxide film as the sacrifice oxide film 47 is formed. Then, the surface of the substrate 46 is polished so that the second substrate 45 is obtained.

Figure 10:
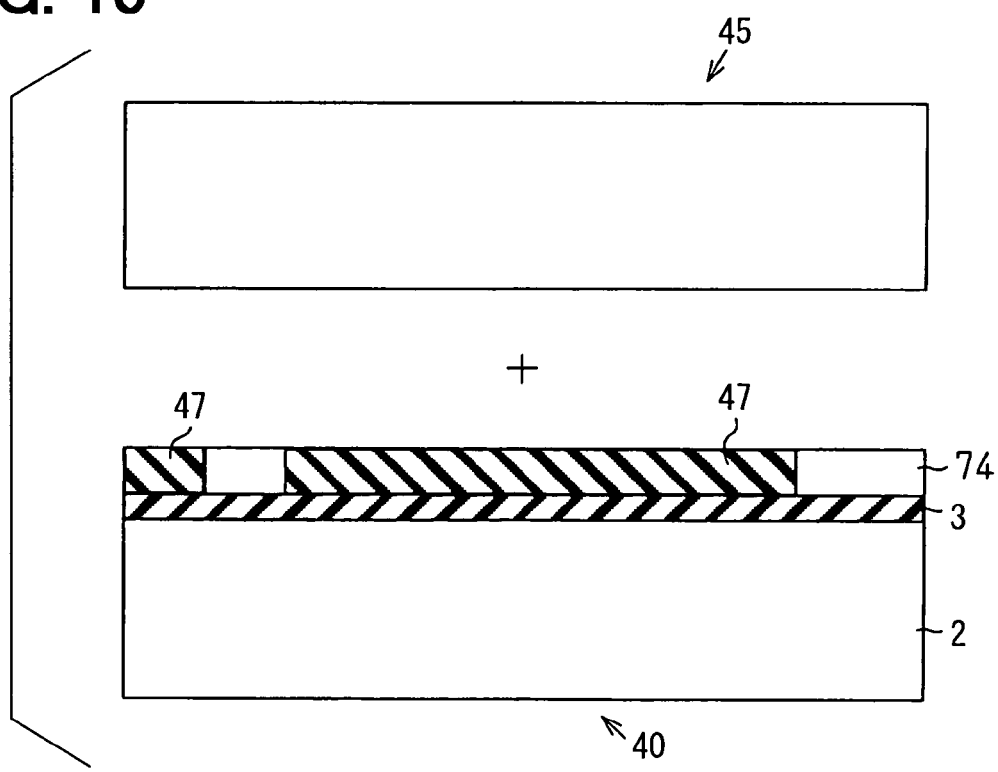
FIG. 10 is a cross sectional view explaining another method for manufacturing a multi-layered substrate of the sensor according to the first embodiment.

The multi-layered substrate 1 can be obtained by bonding the other first and the second substrates 40, 45. For example, as shown in FIG. 10, the first substrate 40 includes the silicon substrate 2, the embedded insulation film 3, the sacrifice oxide film 47 and a silicon layer 74. The embedded insulation film 3 made of silicon nitride is formed on the silicon substrate 2 as the support substrate. The silicon layer 74 is formed on the embedded insulation film 3, and the sacrifice oxide film 47 having a predetermined pattern is embedded on a predetermined surfaced of the silicon layer 74. The sacrifice oxide film 47 reaches the embedded insulation film 3 in the vertical direction of the substrate 2. Specifically, the sacrifice oxide film 47 is disposed from the surface of the silicon layer 74 to the embedded insulation film 3. The second substrate 45 is a silicon substrate. The first and the second substrates 40, 45 are bonded each other so that the multi-layered substrate 1 is formed. In this case, the first substrate 40 can be formed by a combination of the methods shown in FIGS. 7A-9B.

Figure 11A:
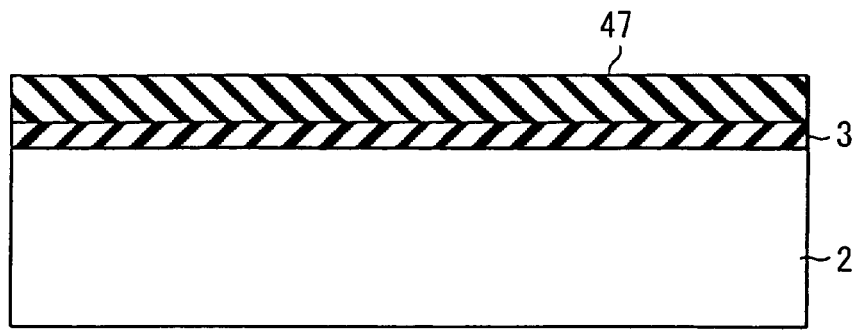
FIGS. 11A to 11C are cross sectional views explaining the third method for manufacturing the multi-layered substrate of the sensor according to the first embodiment.
Figure 11B:
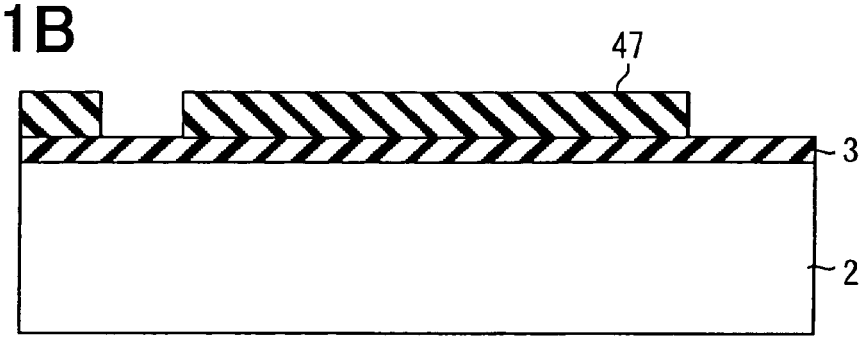
Figure 11C:
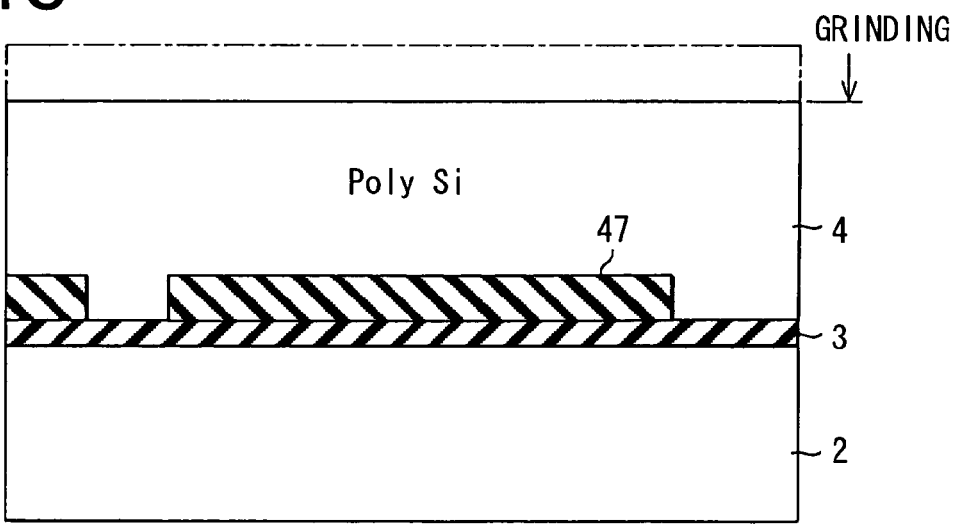

Further, the multi-layered substrate 1 can be formed as follows. As shown in FIG. 11A, the embedded insulation film 3 made of a silicon nitride film and the sacrifice oxide film 47 made of a silicon oxide film are formed on the silicon substrate 2 in this order. Then, the sacrifice oxide film 47 is patterned to be a predetermined pattern. Then, as shown in FIG. 1C, the silicon layer 4 made of a poly silicon film is formed on the sacrifice oxide film 47. After that, the surface of the silicon layer 4 is polished. In this case, the silicon layer 4 can be made of a single crystalline film or a poly crystalline film.

Figure 12A:
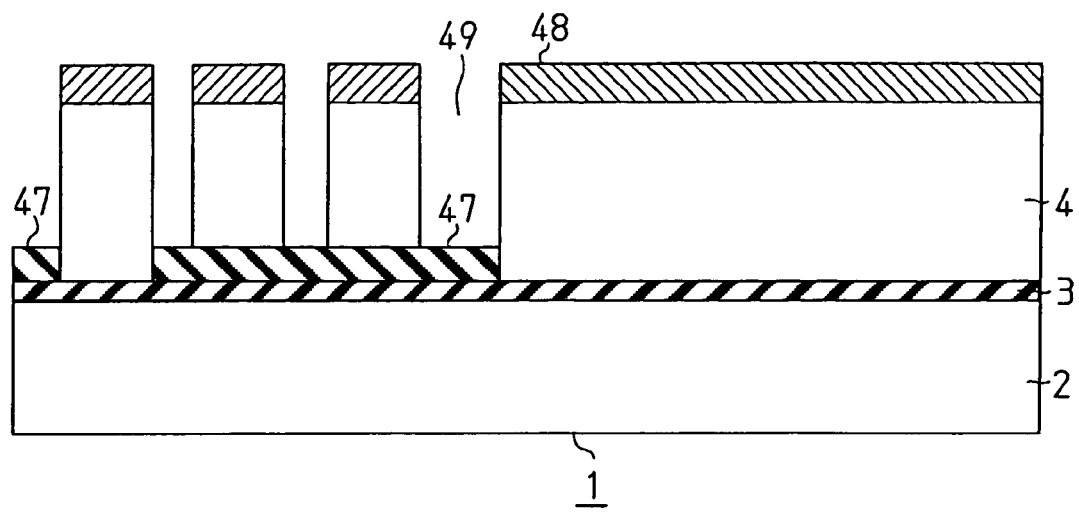
FIG. 12A is a cross sectional view explaining a method for manufacturing a semiconductor acceleration sensor according to a modification of the first embodiment.
Figure 12B:
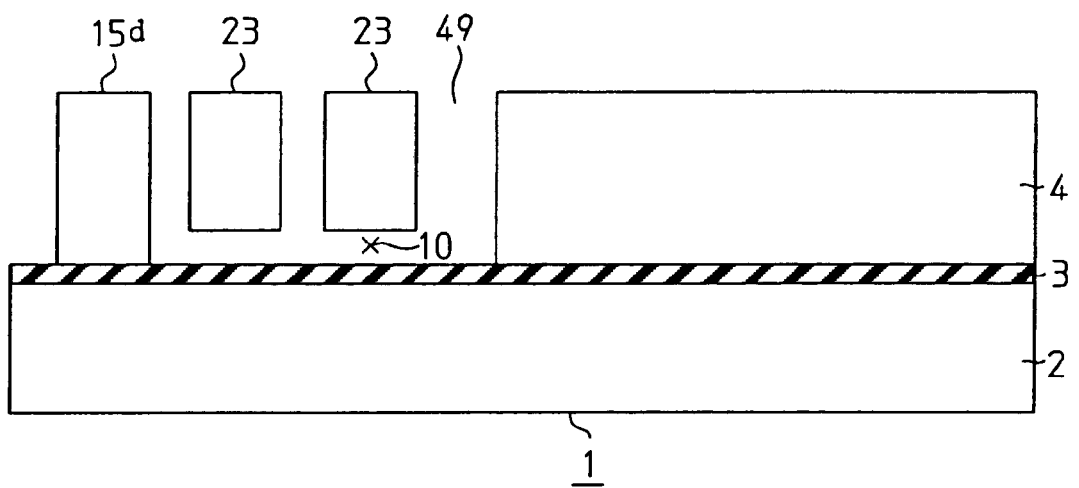
FIG. 12B is a cross sectional view showing the sensor according to the modification of the first embodiment.

Further, regarding arrangement of the sacrifice oxide film 47 as the sacrifice layer, one end of the sacrifice oxide film 47 can be formed to contact the sidewall of the groove 49. Then, as shown in FIG. 12B, the sacrifice oxide film 47 is removed. In this case, no notch is disposed under the fixed electrode. Specifically, no sacrifice oxide film 47 is disposed under the fixed electrode. Here, in FIG. 6B, a notch N1 is disposed under the fixed electrode 15d.

Figure 13:
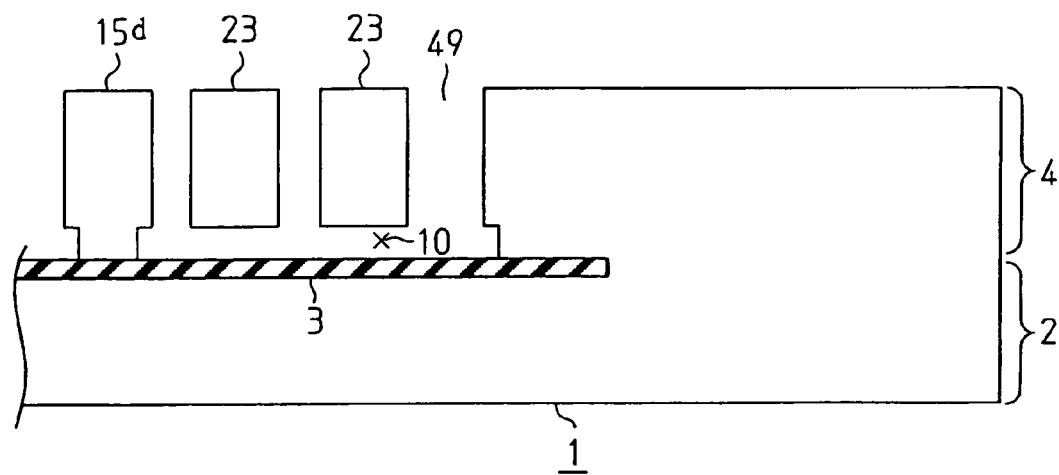
FIG. 13 is a cross sectional view showing a semiconductor acceleration sensor according to the second modification of the first embodiment.
Figure 14:
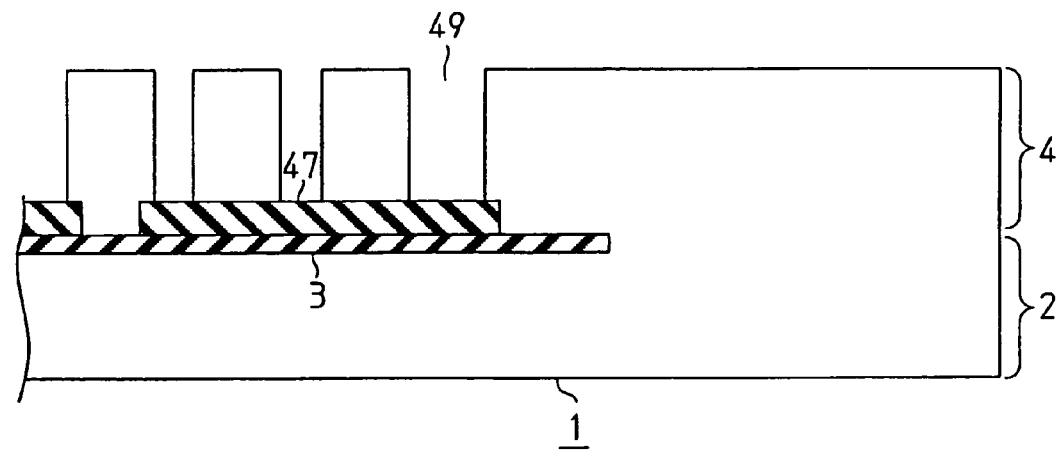
FIG. 14 is a cross sectional view explaining a method for manufacturing the sensor according to the second modification of the first embodiment.

Further, as shown in FIG. 13, the embedded insulation film 3 doesn't need to form on a part of the silicon substrate 2, the part which doesn't need electric insulation between the silicon substrate 2 and the silicon layer 4. Specifically, as shown in FIG. 14, no embedded insulation film 3 is formed on the part of the silicon substrate 2 before the sacrifice oxide film 47 is removed. The part of the silicon substrate 2 is, for example, a periphery of the sensor, which does not need to isolate from the substrate 2. The frame 13 disposed on the periphery of the sensor does not need to have electric insulation when the sensor detects the physical quantity such as acceleration. The electric potential of the frame 13 can be equal to the electric potential of the silicon substrate 2. Further, the frame 13 does not have the cavity 10 so that the frame 13 has no embedded insulation film 3. Thus, excess embedded insulation film 3 is not disposed on the part of the substrate 2 so that stress caused by the excess embedded insulation film 3 is reduced. Thus, curvature deformation of the multi-layered substrate 1 is prevented.

The sacrifice oxide film 47 is made of a silicon oxide film. However, the sacrifice oxide film 47 can be made of other materials as long as the sacrifice oxide film 47 has etching selectivity compared with the semiconductor layer such as the silicon layer 4. The sacrifice oxide film 47 can be made of a silicon nitride film. Regarding the embedded insulation film 3 as the etching stopper, the embedded insulation film 3 is made of a silicon nitride film when the sacrifice oxide film 47 is made of a silicon oxide film. However, the embedded insulation film 3 can be made of other materials. For example, when the sacrifice oxide film 47 is made of material other than the silicon oxide film, the embedded oxide film 3 can be made of a silicon oxide film. Here, as long as the etching rate of the sacrifice oxide film 3 is much larger than that of the embedded insulation film 3 so that the sacrifice oxide film 3 has large etching selectivity compared with the embedded insulation film 3.

Further, the weight portion 24 can have a through hole in the vertical direction of the substrate 1 so that etchant or etching particle easily penetrates through the through hole. Thus, the cavity 10 is easily formed.

Although the sensor is the acceleration sensor, other sensors such as an angular rate sensor and an angular acceleration sensor can be manufactured by the above methods.

Second Embodiment

Figure 15:
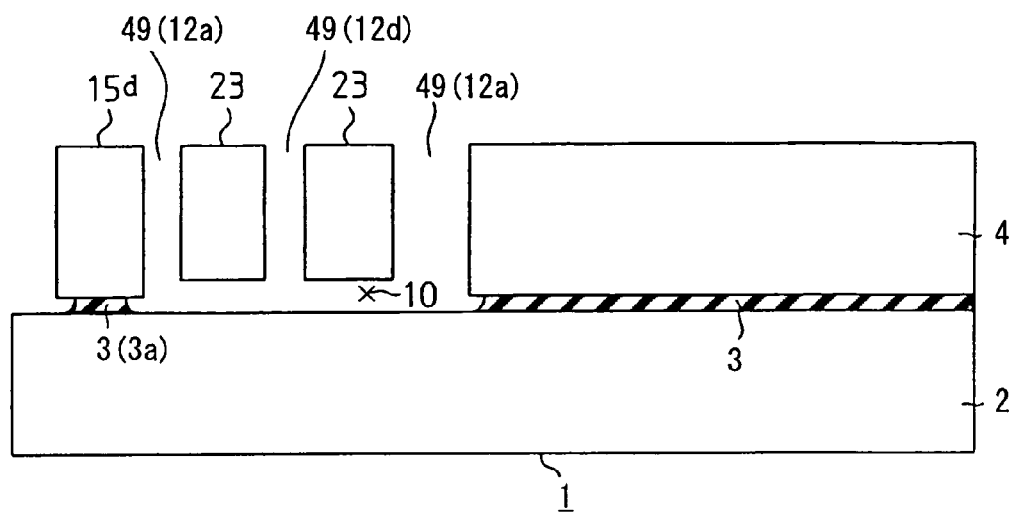
FIG. 15 is a cross sectional view showing a semiconductor acceleration sensor according to a second embodiment of the present invention.

A semiconductor acceleration sensor according to a second embodiment of the present invention is shown in FIG. 15. FIG. 15 is a cross section of the sensor taken along line IV-IV in FIG. 1.

The sensor includes the silicon substrate 2, the embedded insulation film 3 and the silicon layer 4, which are stacked in this order so that the multi-layered substrate 1 is formed. Here, the cavity 10 is disposed under the movable portion such as the beam 23, and the embedded insulation film 3 is disposed under the fixed portion such as the fixed electrode 15d.

Figure 16:
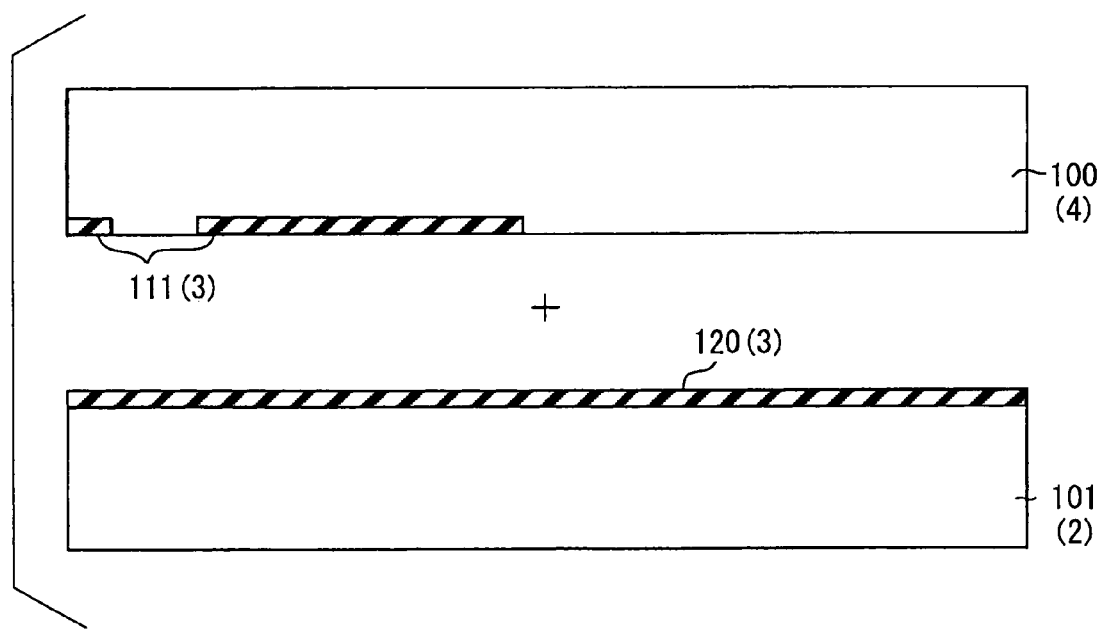
FIG. 16 is a cross sectional view explaining a method for manufacturing the sensor according to the second embodiment.
Figure 17:
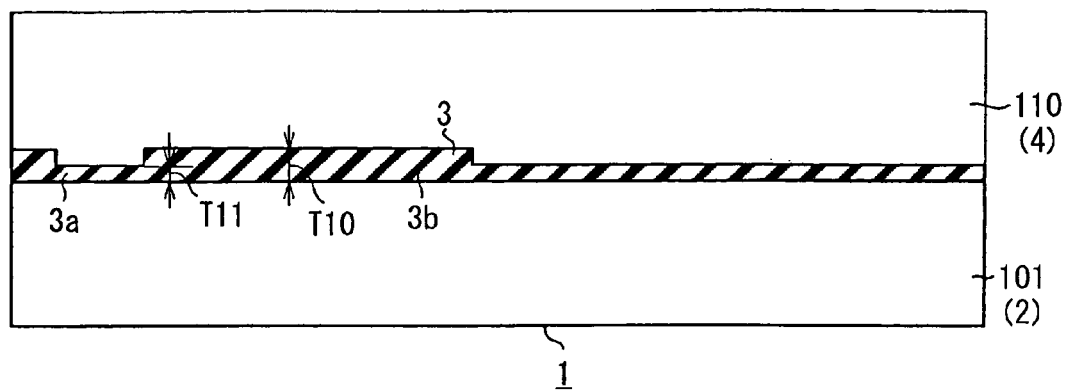
FIG. 17 is a cross sectional view explaining the method for manufacturing the sensor according to the second embodiment.

The method for manufacturing the sensor is described as follows. As shown in FIG. 17, the multi-layered substrate 1 having the embedded insulation film 3 as a sacrifice layer is prepared. The embedded insulation film 3 is made of a silicon oxide film. Specifically, as shown in FIG. 16, the first substrate 101 having a silicon oxide film 120 disposed on the substrate 101 is prepared. Further, the second substrate 110 having a silicon oxide film 111 disposed on a predetermined surface of the substrate 110 is prepared. The first and the second substrates 101, 110 are bonded each other. The embedded insulation film 3 has at least two different thicknesses. Specifically, the part of the embedded insulation film 3 to be the cavity 10 has large thickness T10, and the other part of the embedded insulation film 3 to be disposed under the fixed electrodes 15a-15d, 16a-16d has small thickness T11. The thickness T10 is larger than the thickness T11.

Figure 18:
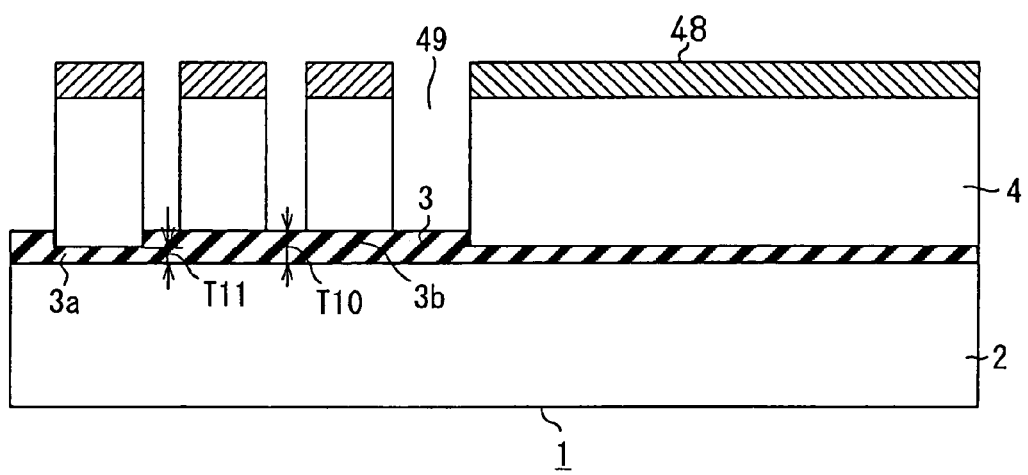
FIG. 18 is a cross sectional view explaining the method for manufacturing the sensor according to the second embodiment.
Figure 19A:
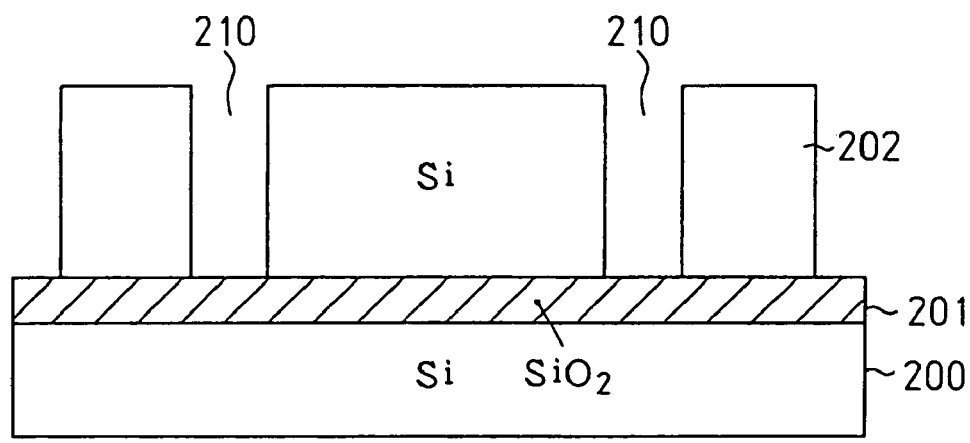
FIGS. 19A and 19B are cross sectional views showing a semiconductor acceleration sensor according to a prior art.
Figure 19B:
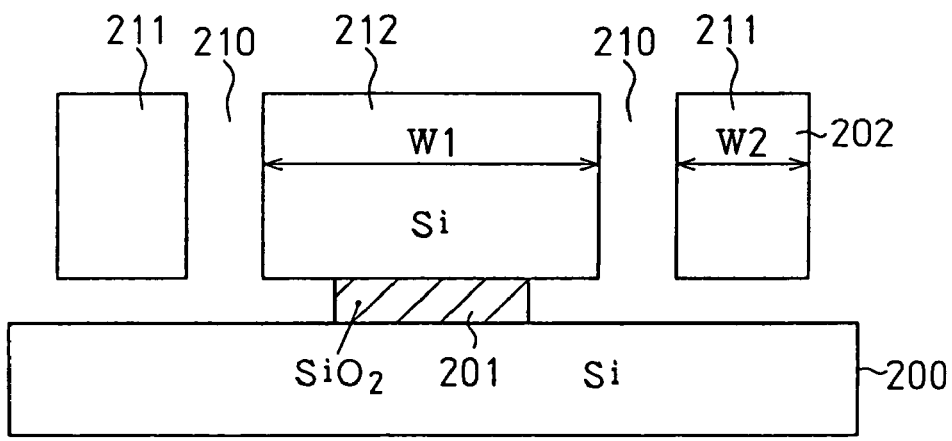

Then, as shown in FIG. 18, the groove 49 is formed on the surface of the silicon layer 4 so that the groove 49 reaches the embedded insulation film 3. The groove 49 extends in the vertical direction of the substrate 2. Successively, the embedded insulation film 3 is isotropically etched from the bottom of the groove 49 so that the part of the embedded insulation film 3 having the large thickness, i.e., a thick part 3b of the embedded insulation film 3 is removed. Thus, the cavity 10 extending in the horizontal direction of the substrate 2 is formed so that the movable portion is separated from the substrate.

Another part of the embedded insulation film 3 having small thickness, i.e., a thin part 3a of the sacrifice oxide film 3 remains so that the fixed portion such as the fixed electrodes 15a-15d, 16a-16d is fixed on the substrate 2 through the thin part 3a of the embedded insulation film 3. Thus, the embedded insulation film 3 disposed under the movable-portion-to-be-formed region has large thickness so that the embedded insulation film 3 is selectively etched. Here, the thin part 3a of the embedded insulation film 3 is also disposed under the anchors 20, 21.

Third Embodiment

Figure 20:
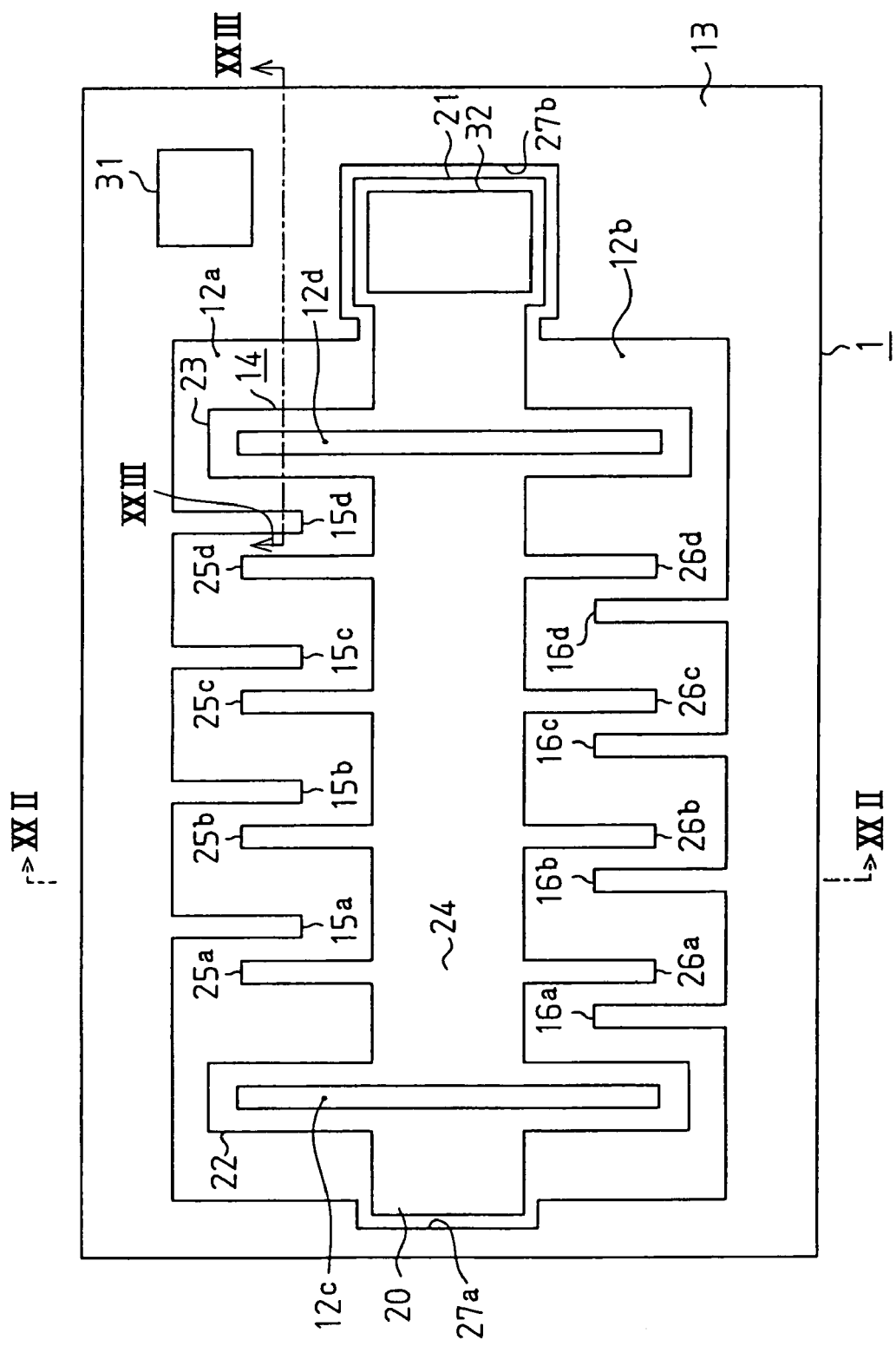
FIG. 20 is a plan view showing a semiconductor acceleration sensor according to a third embodiment of the present invention.
Figure 21:
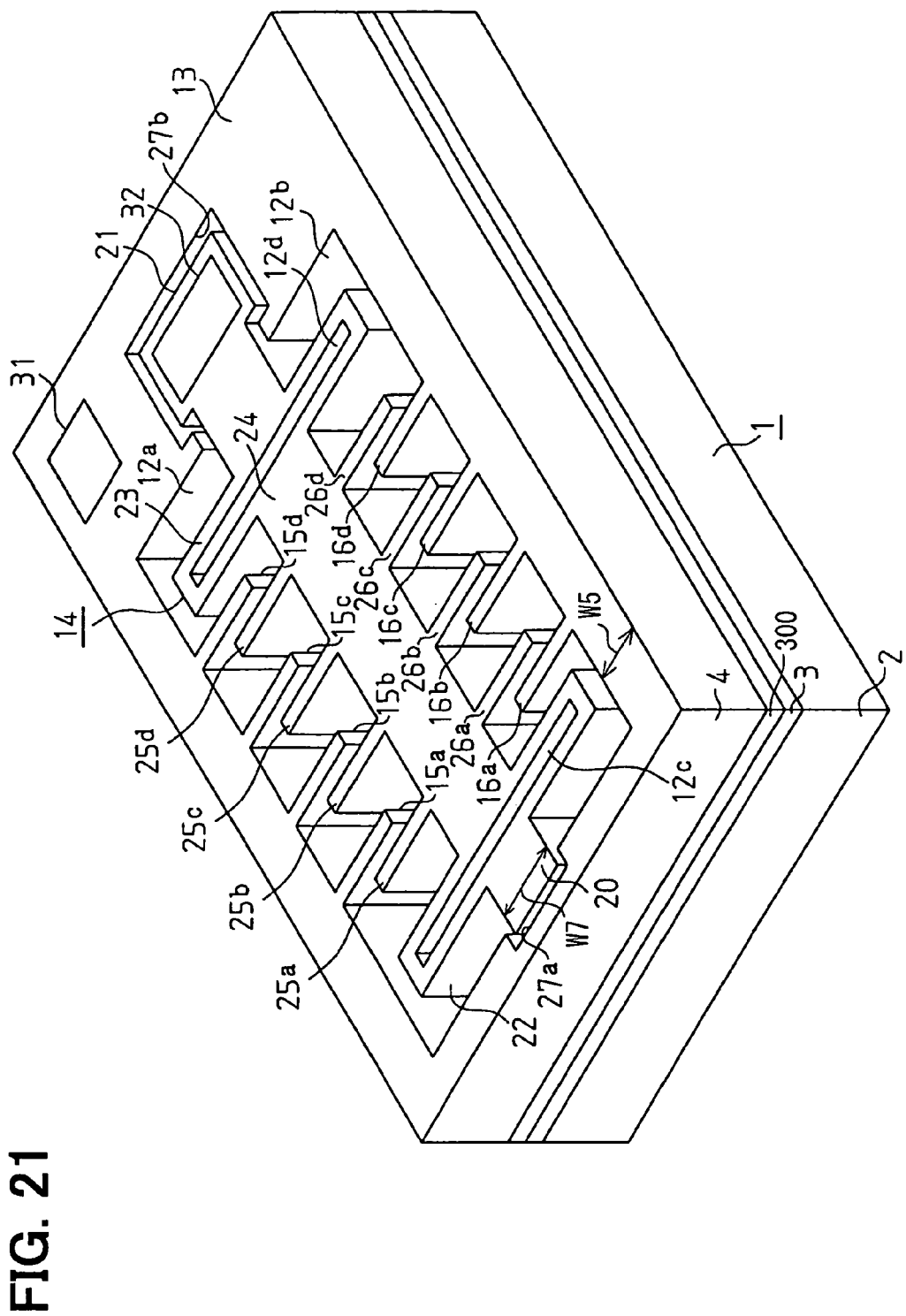
FIG. 21 is a perspective view showing the sensor according to the third embodiment.
Figure 22:
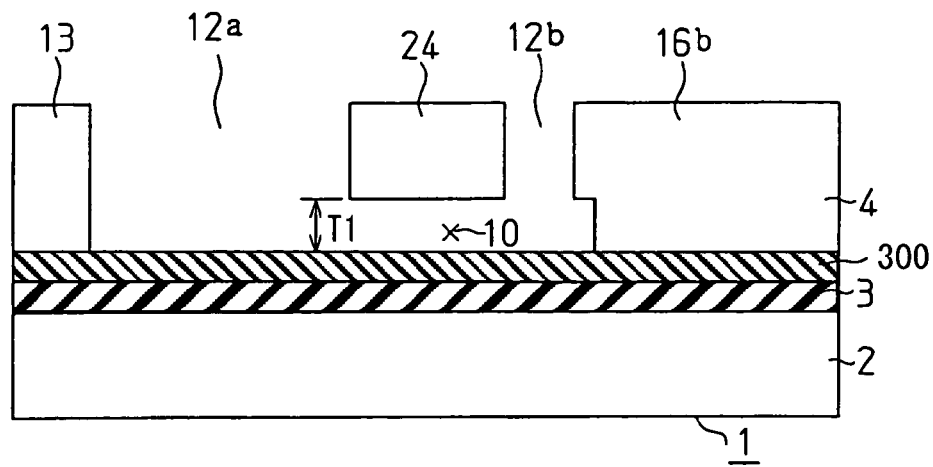
FIG. 22 is a cross sectional view showing the sensor taken along line XXII-XXII in FIG. 20.
Figure 23:
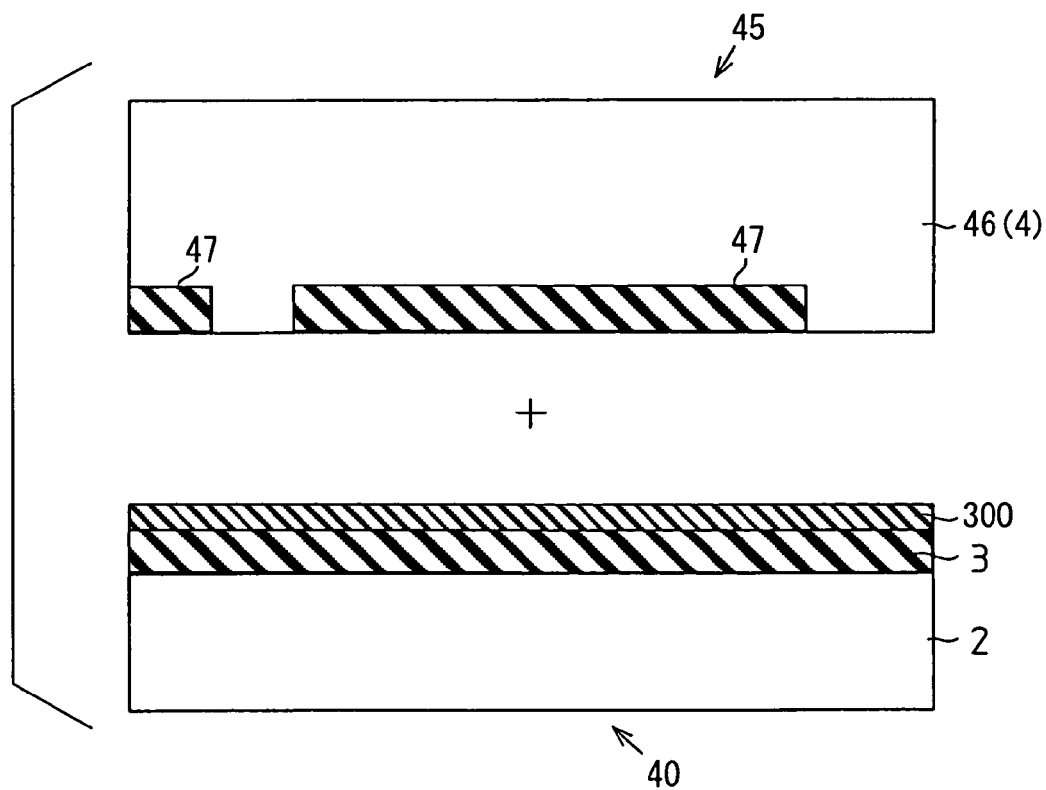
FIG. 23 is a cross sectional view explaining a method for manufacturing the sensor according to the third embodiment.
Figure 24A:
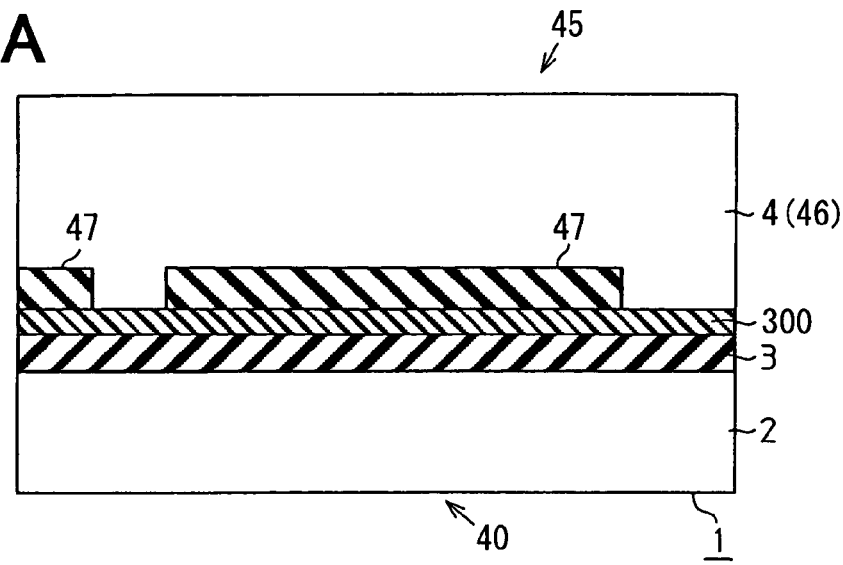
FIGS. 24A to 24C are cross sectional views explaining the method for manufacturing the sensor according to the third embodiment.
Figure 24B:
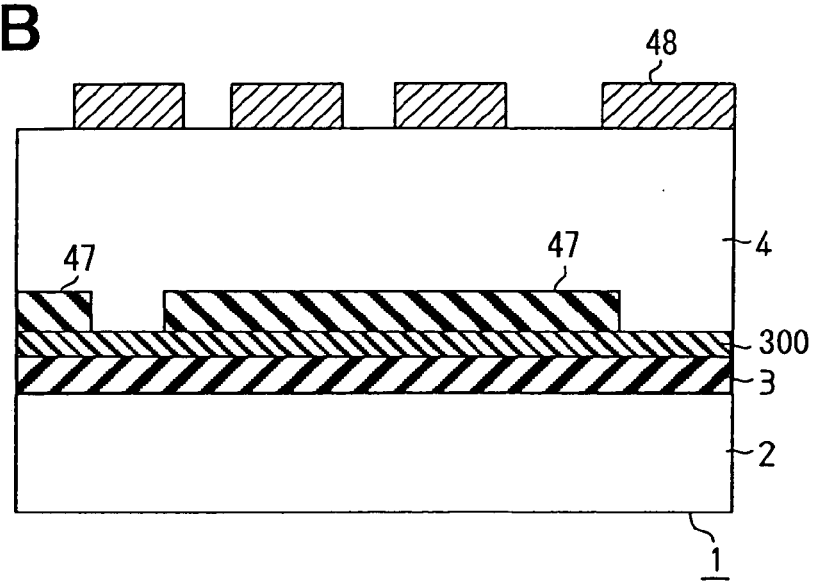
Figure 24C:
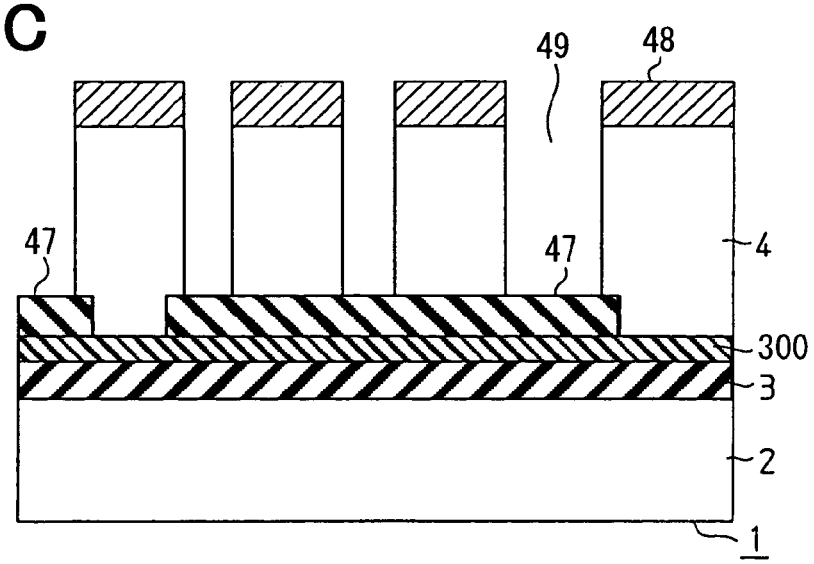
Figure 25A:
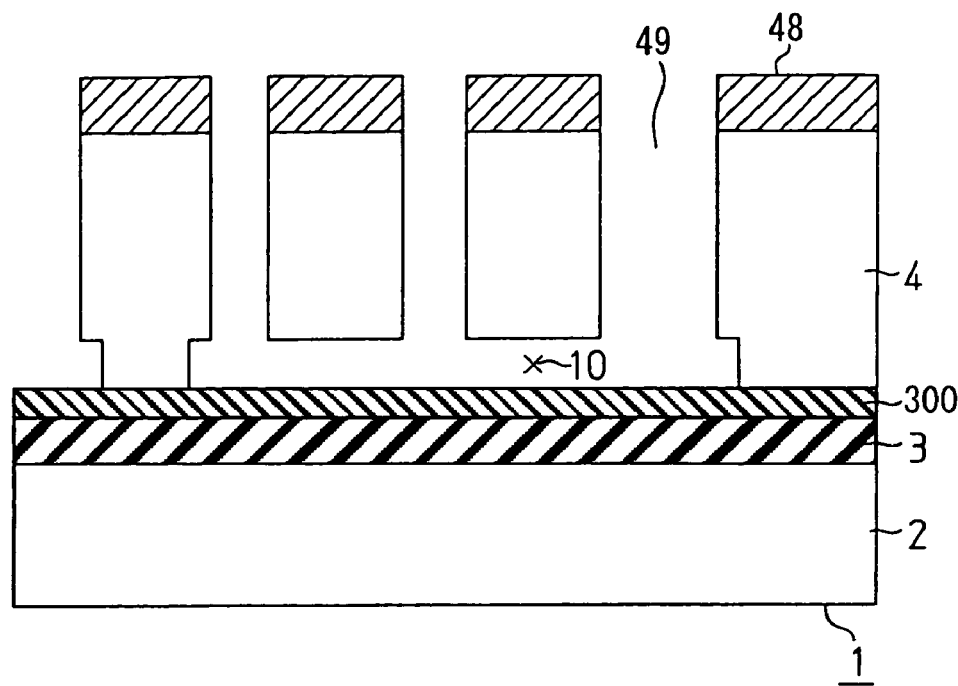
FIGS. 25A and 25B are cross sectional views explaining the method for manufacturing the sensor according to the third embodiment.
Figure 25B:
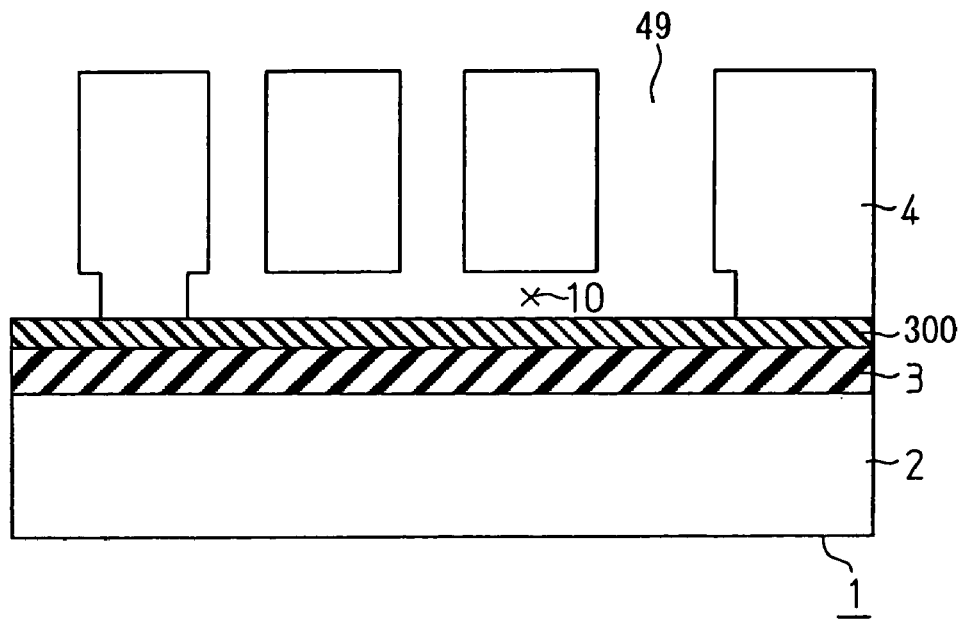
Figure 26A:
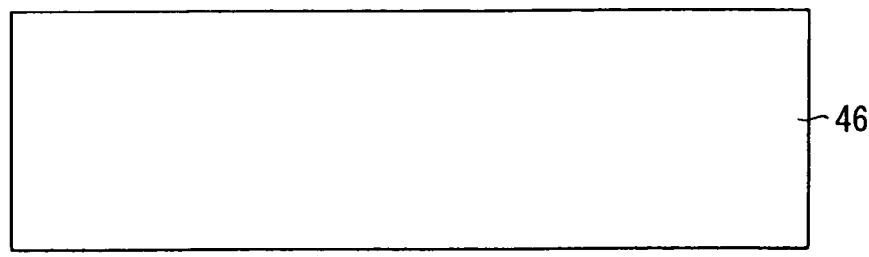
FIGS. 26A to 26D are cross sectional views explaining a method for manufacturing the second substrate of the sensor according to the third embodiment.
Figure 26B:
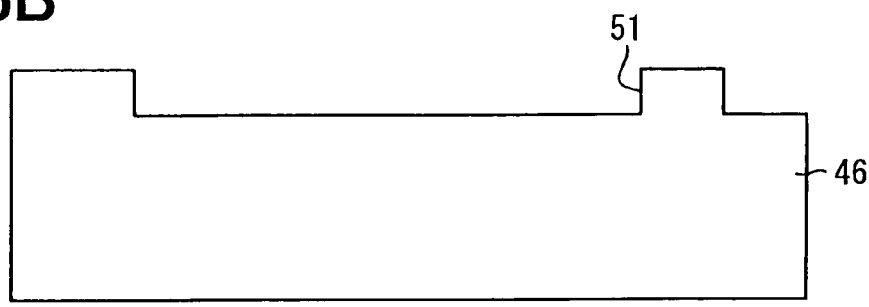
Figure 26C:
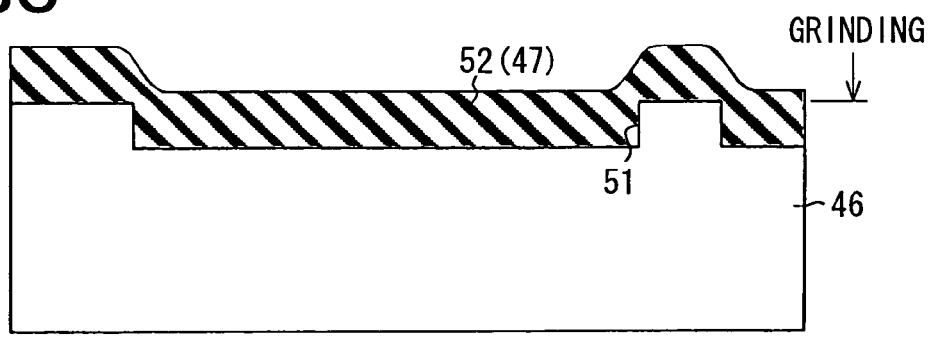
Figure 26D:
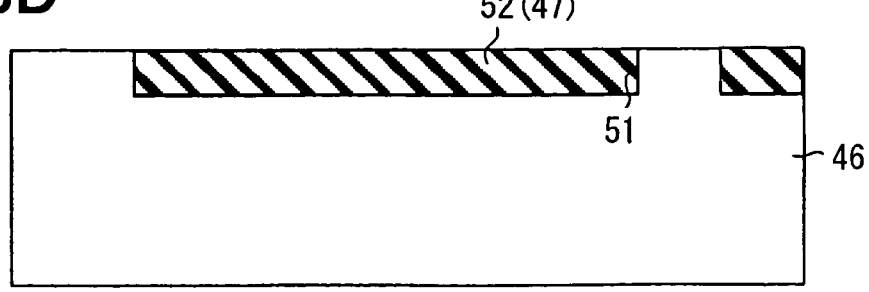
Figure 27A:
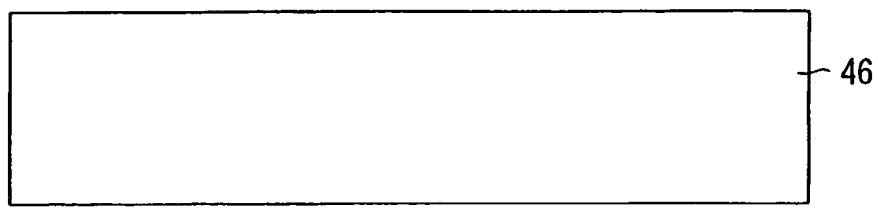
FIGS. 27A to 27D are cross sectional views explaining another method for manufacturing the second substrate of the sensor according to the third embodiment.
Figure 27B:
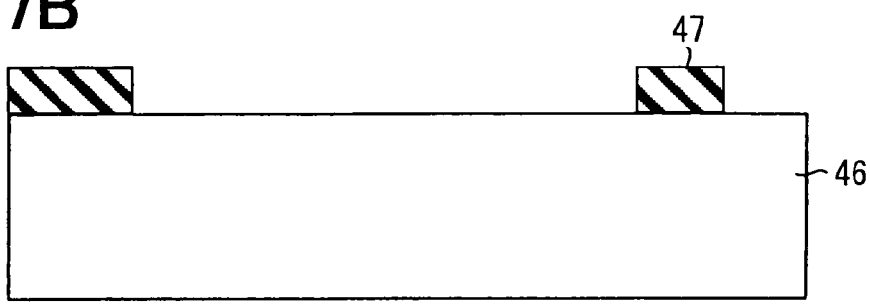
Figure 27C:
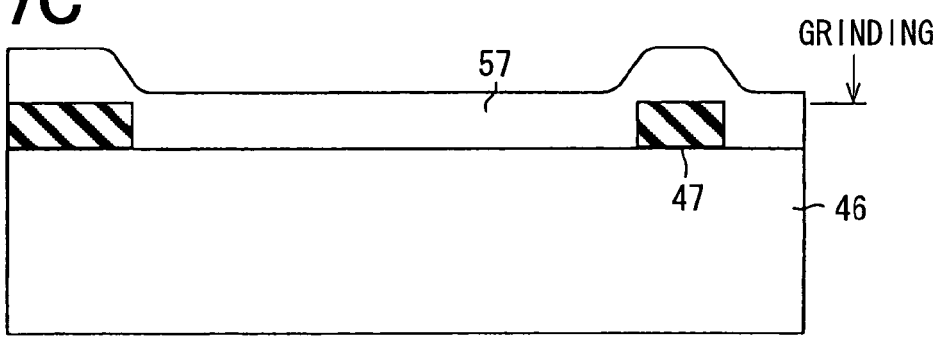
Figure 27D:
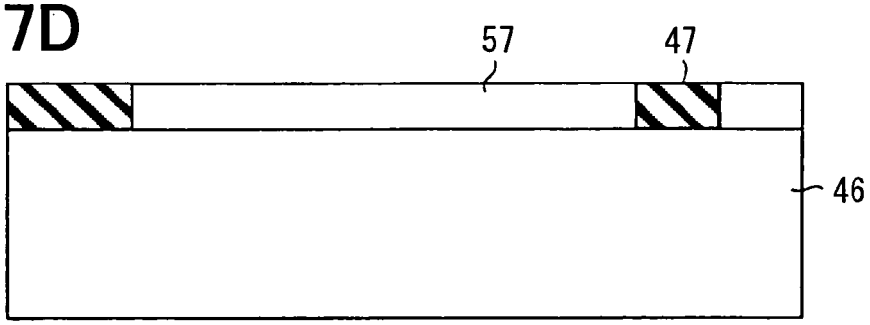

A physical quantity sensor according to a third embodiment of the present invention is shown in FIGS. 20-22. The sensor includes a silicon nitride film 300 as a protection layer. The silicon nitride film 300 covers the embedded insulation film 3 made of a silicon oxide film so that the embedded insulation film 3 is protected from etching when the sacrifice oxide film 47 is removed.

The method for manufacturing the sensor is shown in FIGS. 23 to 25B. The first substrate 40 includes the silicon substrate 2, the embedded insulation film 3 and the silicon nitride film 300. The silicon nitride film 300 is formed on the embedded oxide film 3. The first and the second substrates 40, 45 are bonded each other in such a manner that the silicon nitride film 300 of the first substrate 40 is bonded to the sacrifice oxide film 47 of the second substrate 45. As shown in FIG. 25A, when the cavity 10 is formed by removing the sacrifice oxide film 47, the silicon nitride film 300 protects the embedded insulation film 3 from being etched. Thus, the cavity 10 is formed.

Figure 28A:
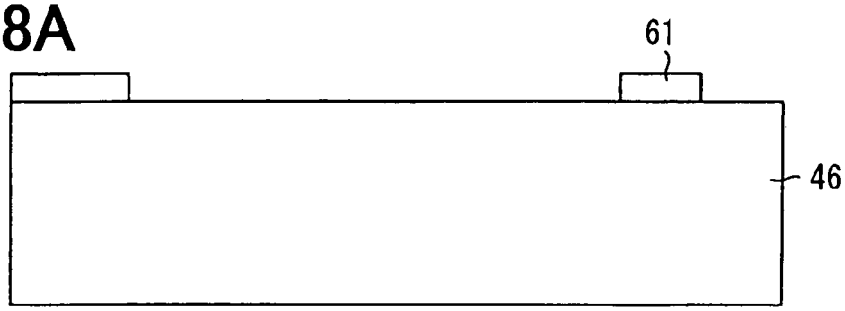
FIGS. 28A and 28B are cross sectional views explaining the third method for manufacturing the second substrate of the sensor according to the third embodiment.
Figure 28B:
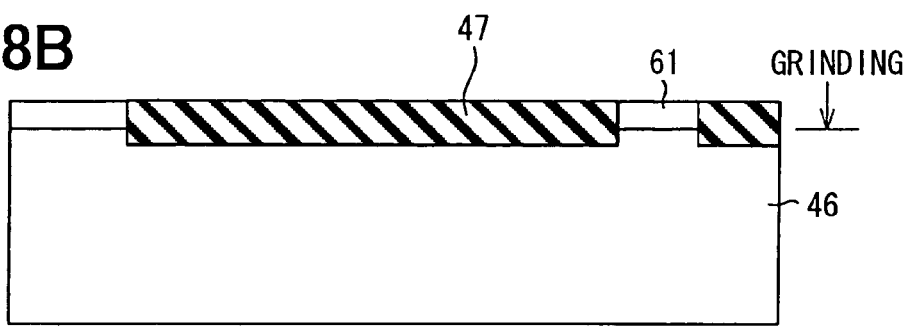

Here, the second substrate 45 is formed by a method shown in FIGS. 26A to 26D. Further, the second substrate 45 can be formed by other methods. For example, the second substrate 45 can be formed by a method shown in FIGS. 27A to 27D. Further, the second substrate 45 can be formed by a method shown in FIGS. 28A and 28B.

Figure 29:
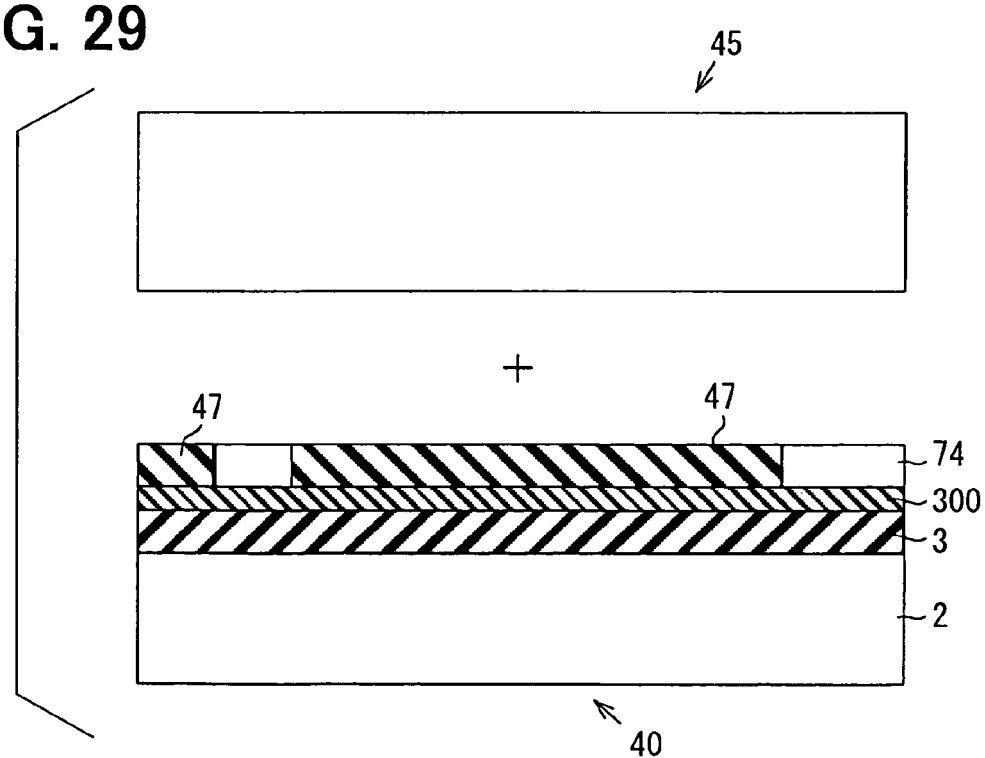
FIG. 29 is a cross sectional view explaining another method for manufacturing a multi-layered substrate of the sensor according to the third embodiment.
Figure 30A:
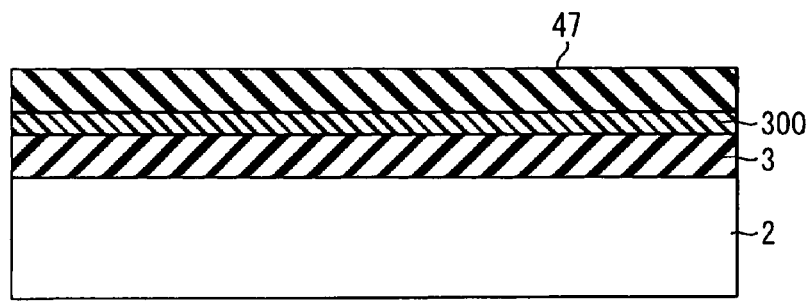
FIGS. 30A to 30C are cross sectional views explaining the third method for manufacturing the multi-layered substrate of the sensor according to the third embodiment.
Figure 30B:
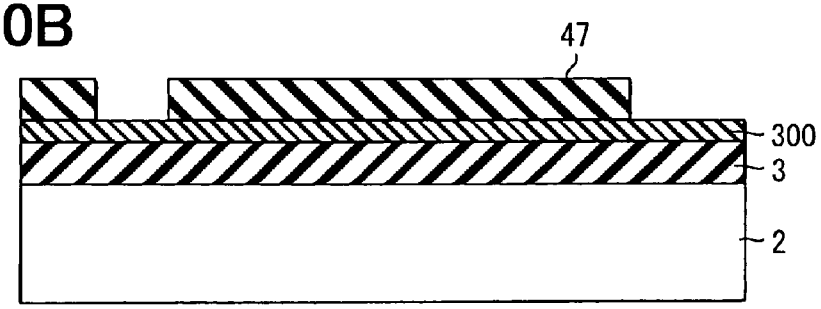
Figure 30C:
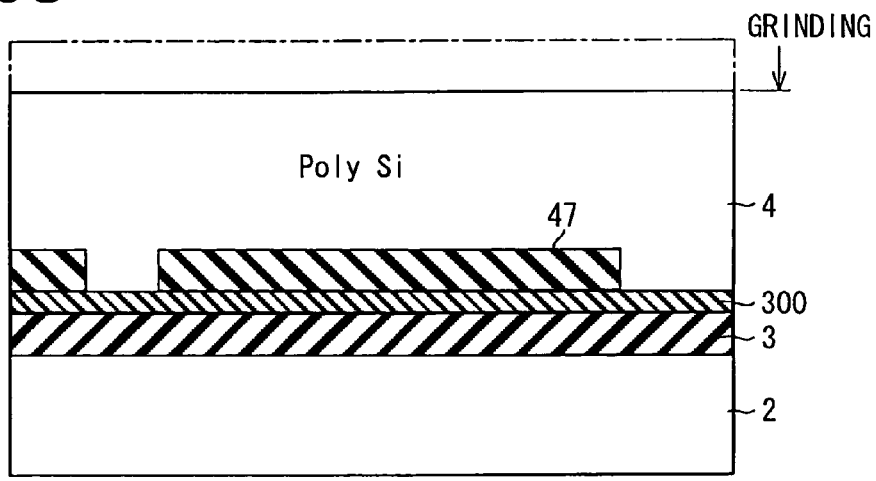

Further, the multi-layered substrate 1 can be formed by a method shown in FIG. 29. Furthermore, the multi-layered substrate 1 can be formed by a method shown in FIGS. 30A to 30C.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a semiconductor physical quantity sensor, which includes a multi-layered substrate, a cavity, a groove, a movable portion and a fixed portion, wherein the multi-layered substrate includes a support substrate, an embedded insulation film, and a semiconductor layer, which are stacked in this order, wherein the cavity extends in a horizontal direction of the multi-layered substrate and disposed between the semiconductor layer and the embedded insulation film, wherein the groove is disposed in the semiconductor layer and reaches the cavity, wherein the movable portion is disposed in the semiconductor layer and separated from the embedded insulation film by the groove and the cavity so that the movable portion is movable, and wherein the fixed portion is supported on the support substrate and separated by the groove, the method comprising the steps of:

preparing the multi-layered substrate having a sacrifice layer, which is embedded in the semiconductor layer so that the sacrifice layer is disposed at a cavity-to-be-formed portion;

forming the groove from an upper surface of the semiconductor layer by a trench etching method, wherein the groove extends in a vertical direction of the multi-layered substrate and reaches the sacrifice layer; and selectively etching the sacrifice layer from a bottom of the groove to form the cavity extending in the horizontal direction so that the movable portion is formed.

2. The method according to claim 1, wherein the step of preparing the multi-layered substrate includes the steps of:

forming a first substrate having the support substrate and the embedded insulation film, which works as an etching stopper;

forming a second substrate having the semiconductor layer and the sacrifice layer, which is embedded on a surface of the semiconductor layer; and bonding the first and the second substrates so that the multi-layered substrate is formed.

3. The method according to claim 1, wherein the step of preparing the multi-layered substrate includes the steps of:

forming a first substrate having the support substrate, the embedded insulation film, a first semiconductor layer and the sacrifice layer, wherein the embedded insulation film works as an etching stopper, wherein the first semiconductor layer is disposed on the support substrate through the embedded insulation film, and wherein the sacrifice layer is embedded on a surface of the first semiconductor layer;

preparing a second substrate having a second semiconductor layer; and bonding the first and the second substrates so that the multi-layered substrate is formed.

4. The method according to claim 1, wherein
the step of preparing the multi-layered substrate includes the steps of:
  forming the embedded insulation film as an etching stopper on the support substrate;
  forming the sacrifice layer on the embedded insulation film; and
  forming the semiconductor layer made of poly crystal semiconductor on the sacrifice layer so that the multi-layered substrate is prepared.

5. The method according to claim 1, wherein
the multi-layered substrate further includes a protection layer disposed on the embedded insulation film, and
wherein the protection layer is made of a material, which is prevented from being etched in the step of selectively etching the sacrifice layer so that the protection layer protects the embedded insulation film.

6. A method for manufacturing a semiconductor physical quantity sensor, which includes a multi-layered substrate, a cavity, a groove, a movable portion and a fixed portion, wherein the multi-layered substrate includes a support substrate, an embedded insulation film, and a semiconductor layer, which are stacked in this order, wherein the cavity extends in a horizontal direction of the multi-layered substrate and disposed between the semiconductor layer and the support substrate, wherein the groove is disposed in the semiconductor layer and reaches the cavity, wherein the movable portion is disposed in the semiconductor layer and separated from the support substrate by the groove and the cavity so that the movable portion is movable, and wherein the fixed portion is supported on the support substrate and separated by the groove, the method comprising the steps of:
  preparing the multi-layered substrate having a sacrifice layer, which includes a thin portion and a thick portion, and is embedded in the semiconductor layer, wherein the thin portion of the sacrifice layer is disposed under a fixed-portion-to-be-formed portion, and the thick portion of the sacrifice layer is disposed at a cavity-to-be-formed portion;
  forming the groove from an upper surface of the semiconductor layer by a trench etching method, wherein the groove extends in a vertical direction of the multi-layered substrate and reaches the sacrifice layer; and
  isotropically etching the sacrifice layer from a bottom of the groove to remove the thick portion of the sacrifice layer and to remain the thin portion of the sacrifice layer as the embedded insulation film so that the cavity, the movable portion and the fixed portion are formed.

* * * * *